United States Patent
Katsuta

(10) Patent No.: US 12,027,544 B2
(45) Date of Patent: *Jul. 2, 2024

(54) DETECTION DEVICE

(71) Applicant: Japan Display Inc., Tokyo (JP)

(72) Inventor: Tadayoshi Katsuta, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/197,229

(22) Filed: May 15, 2023

(65) Prior Publication Data

US 2023/0282657 A1 Sep. 7, 2023

Related U.S. Application Data

(63) Continuation of application No. 17/741,600, filed on May 11, 2022, now Pat. No. 11,695,026, which is a continuation of application No. PCT/JP2020/042156, filed on Nov. 11, 2020.

(30) Foreign Application Priority Data

Nov. 12, 2019 (JP) .................................. 2019-204946

(51) Int. Cl.
*H01L 27/146* (2006.01)
*G06V 40/13* (2022.01)

(52) U.S. Cl.
CPC .... *H01L 27/14612* (2013.01); *G06V 40/1318* (2022.01); *H01L 27/14643* (2013.01)

(58) Field of Classification Search
None
See application file for complete search history.

(56) References Cited

U.S. PATENT DOCUMENTS

| | | | |
|---|---|---|---|
| 7,683,953 B1 | 3/2010 | Merrill | |
| 8,045,028 B1 | 10/2011 | De Wit | |
| 11,695,026 B2 * | 7/2023 | Katsuta | G06V 40/1318 |
| | | | 250/208.2 |
| 2002/0158974 A1 | 10/2002 | Udo et al. | |
| 2010/0328478 A1 | 12/2010 | Tanaka et al. | |
| 2012/0200753 A1 | 8/2012 | Endoh et al. | |

FOREIGN PATENT DOCUMENTS

| | | |
|---|---|---|
| JP | 2002-330348 A | 11/2002 |
| JP | 2011-010054 A | 1/2011 |
| JP | 2011-091487 A | 5/2011 |

OTHER PUBLICATIONS

International Search Report issued in International Patent Application No. PCT/JP2020/042156 dated Feb. 2, 2021 and English translation of same. 5 pages.

Written Opinion issued in International Patent Application No. PCT/JP2020/042156 dated Feb. 2, 2021. 4 pages.

* cited by examiner

*Primary Examiner* — Thanh Luu

(74) *Attorney, Agent, or Firm* — K&L Gates LLP

(57) ABSTRACT

A detection device includes a sensor area in which a plurality of detection elements each comprising a photoelectric conversion element are arranged in a detection region, a drive circuit configured to supply a plurality of drive signals to the detection elements, and a detection circuit configured to process a detection signal output from each of the detection elements.

10 Claims, 27 Drawing Sheets

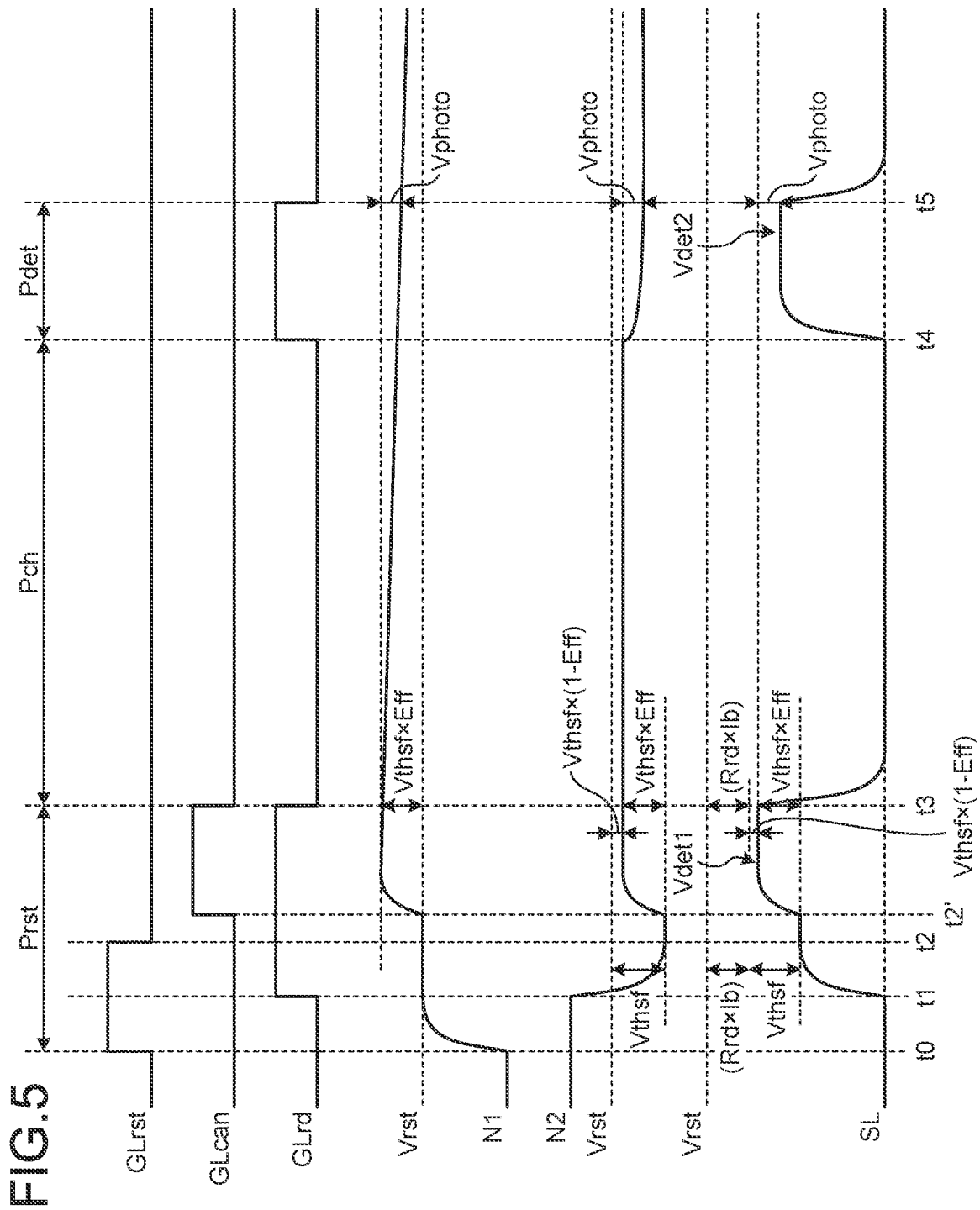

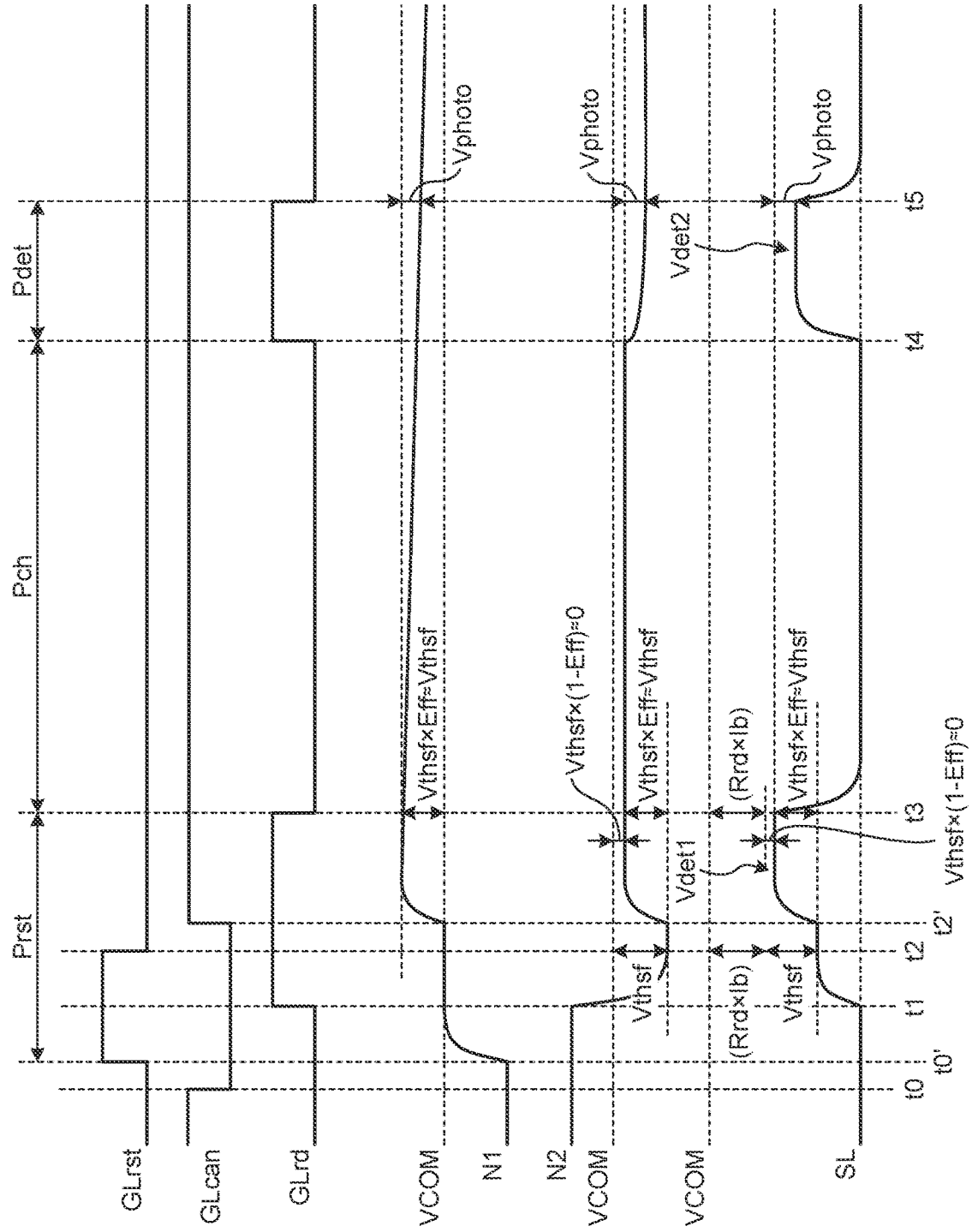

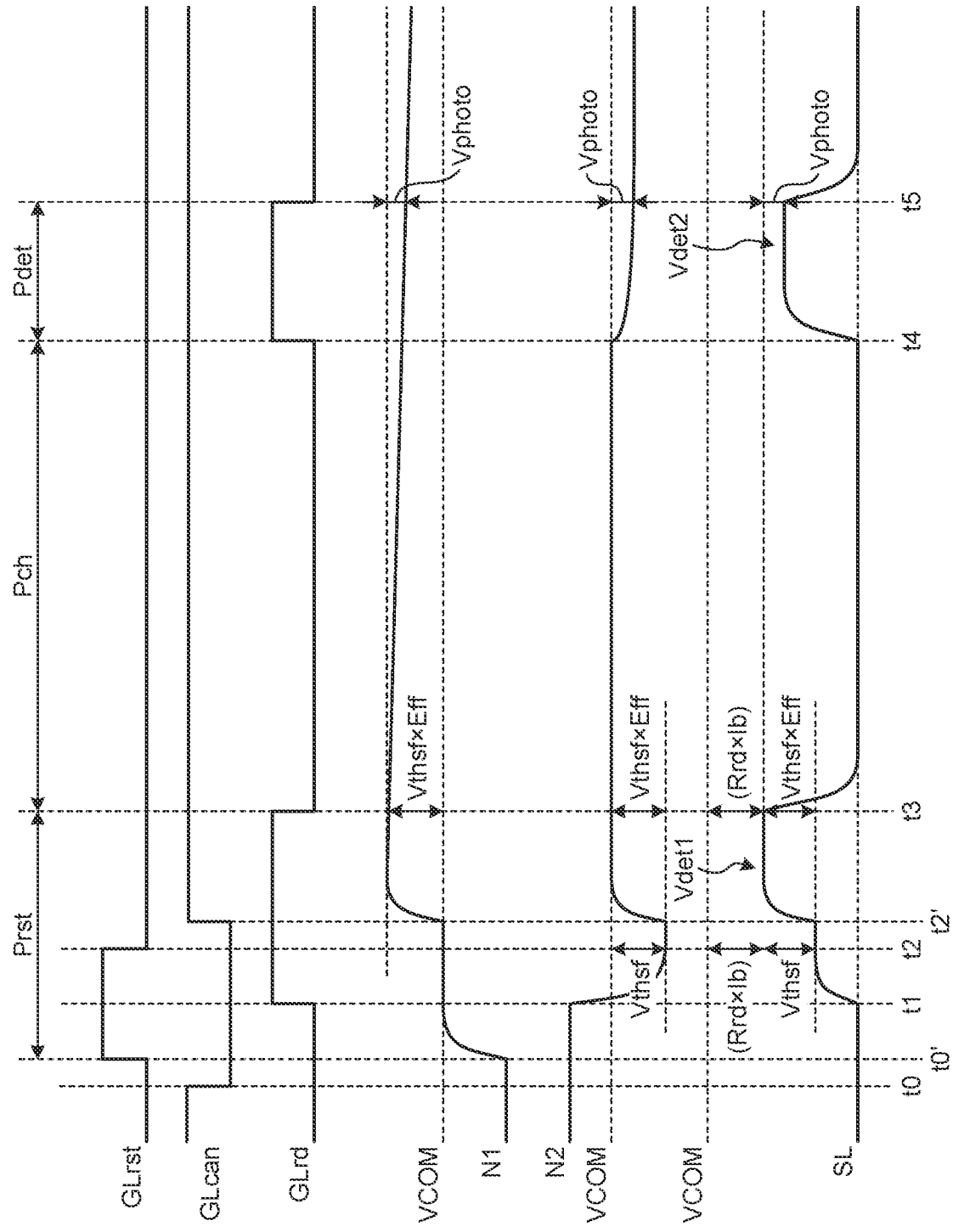

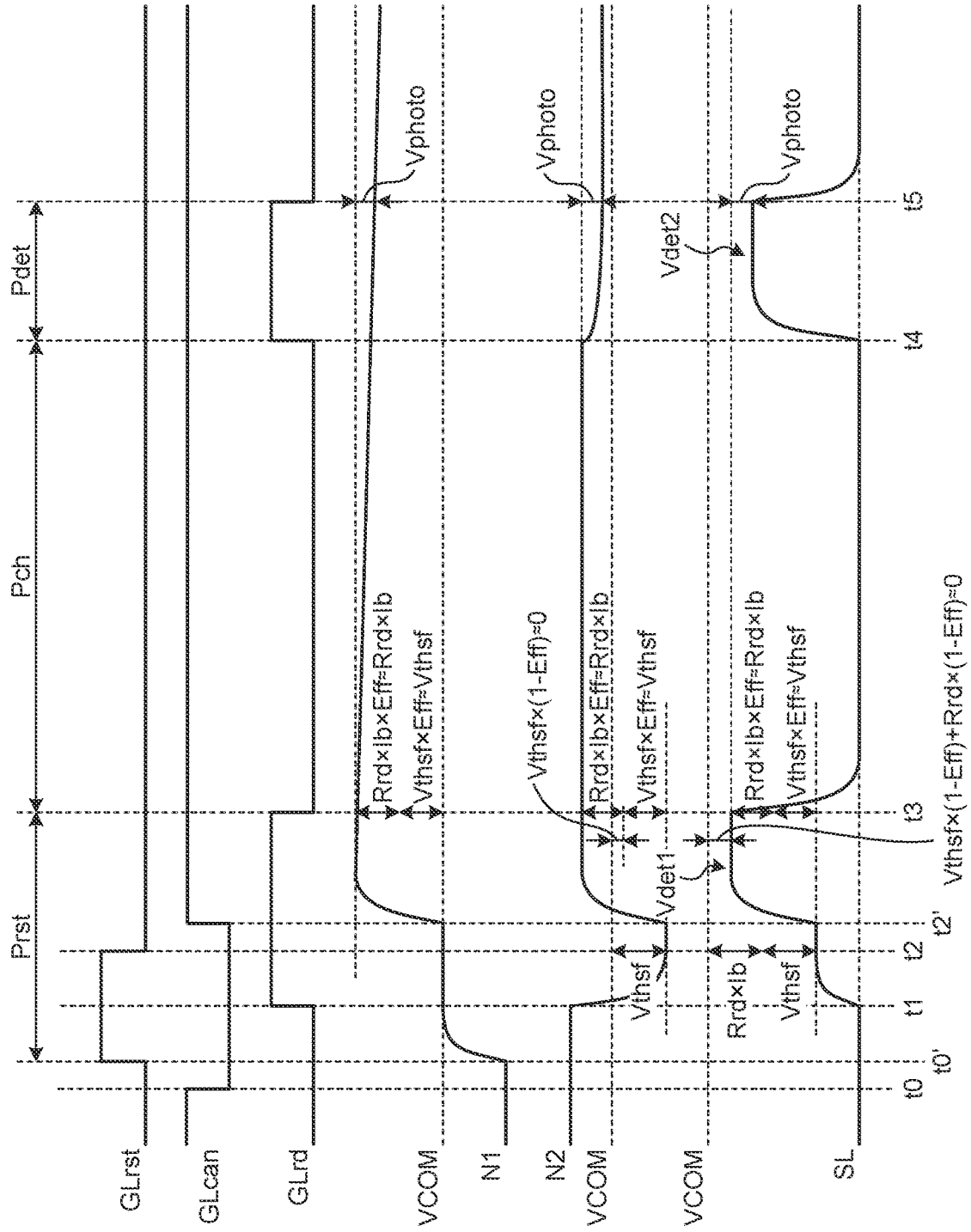

DETECTION DEVICE

CROSS-REFERENCE TO RELATED APPLICATION

This application is a continuation of U.S. patent application Ser. No. 17/741,600, filed on May 11, 2022, which is a continuation of International Patent Application No. PCT/JP2020/042156 filed on Nov. 11, 2020 which designates the United States, incorporated herein by reference, and which claims the benefit of priority from Japanese Patent Application No. 2019-204946 filed on Nov. 12, 2019, incorporated herein by reference.

BACKGROUND

1. Technical Field

The present invention relates to a detection device.

2. Description of the Related Art

Japanese Patent Application Laid-open Publication No. 2011-010054 (JP-A-2011-010054) discloses a photoelectric conversion device that uses a positive-intrinsic-negative (PIN) photodiode as a photoelectric conversion element for detection (refer, for example, to JP-A-2011-010054). Such a photoelectric conversion device transfers an electric charge based on input information photoelectrically converted by a photoelectric converter to an external capacitor, and the external capacitor converts the electric charge into a signal voltage.

In JP-A-2011-010054, each pixel is provided with a source follower circuit that includes a field-effect transistor that receives, at the gate thereof, the signal charge generated by the photoelectric converter, and the field-effect transistor reads the signal voltage corresponding to the signal charge to a signal line. This configuration enables high-speed signal reading, but has the problem that variations in offset potential of the field-effect transistor appear as fixed pattern noise. Therefore, JP-A-2011-010054 discloses that the variations in offset value are corrected by an amount of threshold voltage of the source follower circuit.

In JP-A-2011-010054 described above, a capacitor is precharged at the threshold voltage of a read transistor of the source follower circuit, and a reference potential is applied through the capacitor so as to set the potential of a storage node to a potential shifted by a voltage between both ends of the capacitor from the reference potential. However, the effect of parasitic capacitance of the read transistor and a reset transistor on the voltage between both ends of the capacitor is not considered. This problem may lead to variations in detection values.

It is an object of the present invention to provide a detection device capable of reducing the variations in detection values.

SUMMARY

A detection device according to an embodiment of the present disclosure includes a sensor area in which a plurality of detection elements each comprising a photoelectric conversion element are arranged in a detection region, a drive circuit configured to supply a plurality of drive signals to the detection elements, and a detection circuit configured to process a detection signal output from each of the detection elements. Each of the detection elements includes a source follower transistor configured to output a signal corresponding to an electric charge generated by the photoelectric conversion element, a read transistor configured to read the output signal of the source follower transistor, and output the detection signal, a first reset transistor configured to supply or interrupt a reference potential to a cathode of the photoelectric conversion element, a second reset transistor configured to electrically couple or decouple between an anode of the photoelectric conversion element and a coupling point between the source follower transistor and the read transistor, and a cancel transistor configured to supply or interrupt the reference potential to the anode of the photoelectric conversion element, and a potential obtained by superimposing at least a threshold voltage of the source follower transistor on the reference potential is set as an initial value of a potential applied to the cathode of the photoelectric conversion element in a reset period.

A detection device according to an embodiment of the present disclosure includes a sensor area in which a plurality of detection elements each comprising a photoelectric conversion element are arranged in a detection region, a drive circuit configured to supply a plurality of drive signals to the detection elements, and a detection circuit configured to process a detection signal output from each of the detection elements. Each of the detection elements includes a source follower transistor configured to output a signal corresponding to an electric charge generated by the photoelectric conversion element, a read transistor configured to read the output signal of the source follower transistor, and output the detection signal, a first reset transistor configured to supply or interrupt a reference potential to a cathode of the photoelectric conversion element, a second reset transistor configured to electrically couple or decouple between an anode of the photoelectric conversion element and an output of the read transistor, and a cancel transistor configured to supply or interrupt the reference potential to the anode of the photoelectric conversion element, and a potential obtained by superimposing a threshold voltage of the source follower transistor and a voltage drop caused by on-resistance of the read transistor on the reference potential is set as an initial value of a potential applied to the cathode of the photoelectric conversion element in a reset period.

BRIEF DESCRIPTION OF THE DRAWINGS

FIG. 5 is a timing waveform diagram illustrating an operation example of the detection element according to the comparative example;

FIG. 8A is a timing waveform diagram illustrating an operation example of the detection element according to the first embodiment;

FIG. 8B is a timing waveform diagram illustrating another operation example of the detection element according to the first embodiment;

FIG. 11 is a timing waveform diagram illustrating an operation example of the detection element according to the second embodiment;

DETAILED DESCRIPTION

Figure 1A:
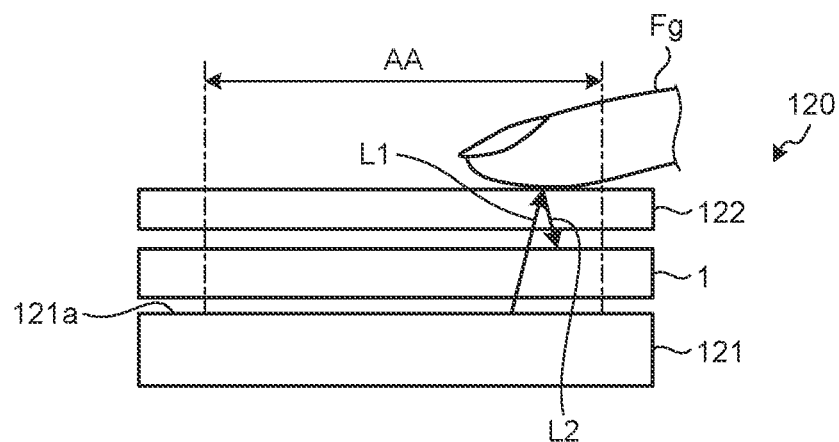
FIG. 1A is a sectional view illustrating a schematic sectional configuration of a detection apparatus having an illumination device, the detection apparatus including a detection device according to embodiments of the present invention.

The following describes modes (embodiments) for carrying out the present invention in detail with reference to the drawings. The present invention is not limited to the description of the embodiments given below. Components described below include those easily conceivable by those skilled in the art or those substantially identical thereto. In addition, the components described below can be combined as appropriate. What is disclosed herein is merely an example, and the present invention naturally encompasses appropriate modifications easily conceivable by those skilled in the art while maintaining the gist of the invention. To further clarify the description, the drawings may schematically illustrate, for example, widths, thicknesses, and shapes of various parts as compared with actual aspects thereof. However, they are merely examples, and interpretation of the present invention is not limited thereto. The same component as that described with reference to an already mentioned drawing is denoted by the same reference numeral through the description and the drawings, and detailed description thereof may not be repeated where appropriate.

In the present specification and claims, in expressing an aspect of disposing another structure above a certain structure, a case of simply expressing "above" includes both a case of disposing the other structure immediately above the certain structure so as to contact the certain structure and a case of disposing the other structure above the certain structure with still another structure interposed therebetween, unless otherwise specified.

FIG. 1A is a sectional view illustrating a schematic sectional configuration of a detection apparatus having an illumination device, the detection apparatus including a detection device according to embodiments of the present invention. As illustrated in FIG. 1A, a detection apparatus 120 having an illumination device includes a detection device 1, an illumination device 121, and a cover glass 122. The illumination device 121, the detection device 1, and the cover glass 122 are stacked in this order in a direction orthogonal to a surface of the detection device 1.

The illumination device 121 has a light-emitting surface 121*a* for emitting light, and emits light L1 from the light-emitting surface 121*a* toward the detection device 1. The illumination device 121 is a backlight. The illumination device 121 may be, for example, what is called a side light-type backlight that includes a light guide plate provided in a position corresponding to a detection region AA and a plurality of light sources arranged at one end or both ends of the light guide plate. For example, light-emitting diodes (LEDs) for emitting light in a predetermined color are used as the light sources. The illumination device 121 may be what is called a direct-type backlight that includes the light sources (such as the LEDs) provided directly below the detection region AA. The illumination device 121 is not limited to the backlight, and may be provided on a lateral side or an upper side of the detection device 1, and may emit the light L1 from the lateral side or the upper side of a finger Fg.

The detection device 1 is provided so as to face the light-emitting surface 121*a* of the illumination device 121. The light L1 emitted from the illumination device 121 passes through the detection device 1 and the cover glass 122. The detection device 1 can detect a detection target (asperities (such as a fingerprint) on a surface of the finger Fg in the example illustrated in FIG. 1A) by detecting light L2 reflected on an interface between the cover glass 122 and air. The color of the light L1 from the illumination device 121 may be varied according to the detection target.

The cover glass 122 is a member for protecting the detection device 1 and the illumination device 121, and covers the detection device 1 and the illumination device 121. The cover glass 122 is, for example, a glass substrate. The cover glass 122 is not limited to a glass substrate, and may be, for example, a resin substrate. The cover glass 122 need not be provided. In this case, the surface of the detection device 1 is provided with a protective layer, and the detection target (the finger Fg in this case) contacts the protective layer of the detection device 1.

The detection apparatus 120 having an illumination device may be provided with a display panel instead of the illumination device 121. The display panel may be, for example, an organic electroluminescent (EL) diode (organic light-emitting diode (OLED)) panel or an inorganic EL display (micro-LED or mini-LED) panel. Alternatively, the display panel may be a liquid crystal display (LCD) panel using liquid crystal elements as display elements or an electrophoretic display (EPD) panel using electrophoretic elements as display elements.

Figure 1B:
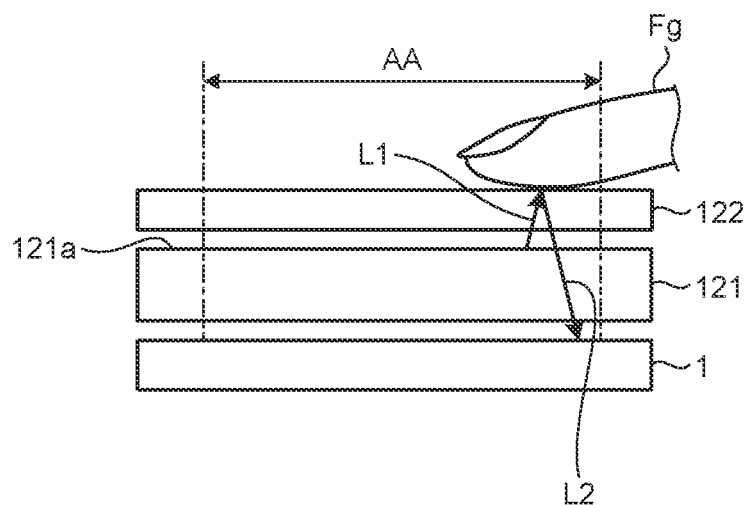
FIG. 1B is a sectional view illustrating a schematic sectional configuration of a detection apparatus having an illumination device according to a modification of the embodiments.

FIG. 1B is a sectional view illustrating a schematic sectional configuration of a detection apparatus having an illumination device according to a modification of the embodiments. As illustrated in FIG. 1B, in the detection apparatus 120 having an illumination device, the detection device 1, the illumination device 121, the cover glass 122 are stacked in this order in the direction orthogonal to the surface of the detection device 1. Also, in the present modification, a display panel such as an organic EL display panel can be employed as the illumination device 121.

The light L1 emitted from the illumination device 121 passes through the cover glass 122, and then, is reflected by the finger Fg. The light L2 reflected by the finger Fg passes through the cover glass 122, and further passes through the illumination device 121. The detection device 1 can perform detection of information on a living body such as the fingerprint detection by receiving the light L2 that has passed through the illumination device 121.

Figure 2:
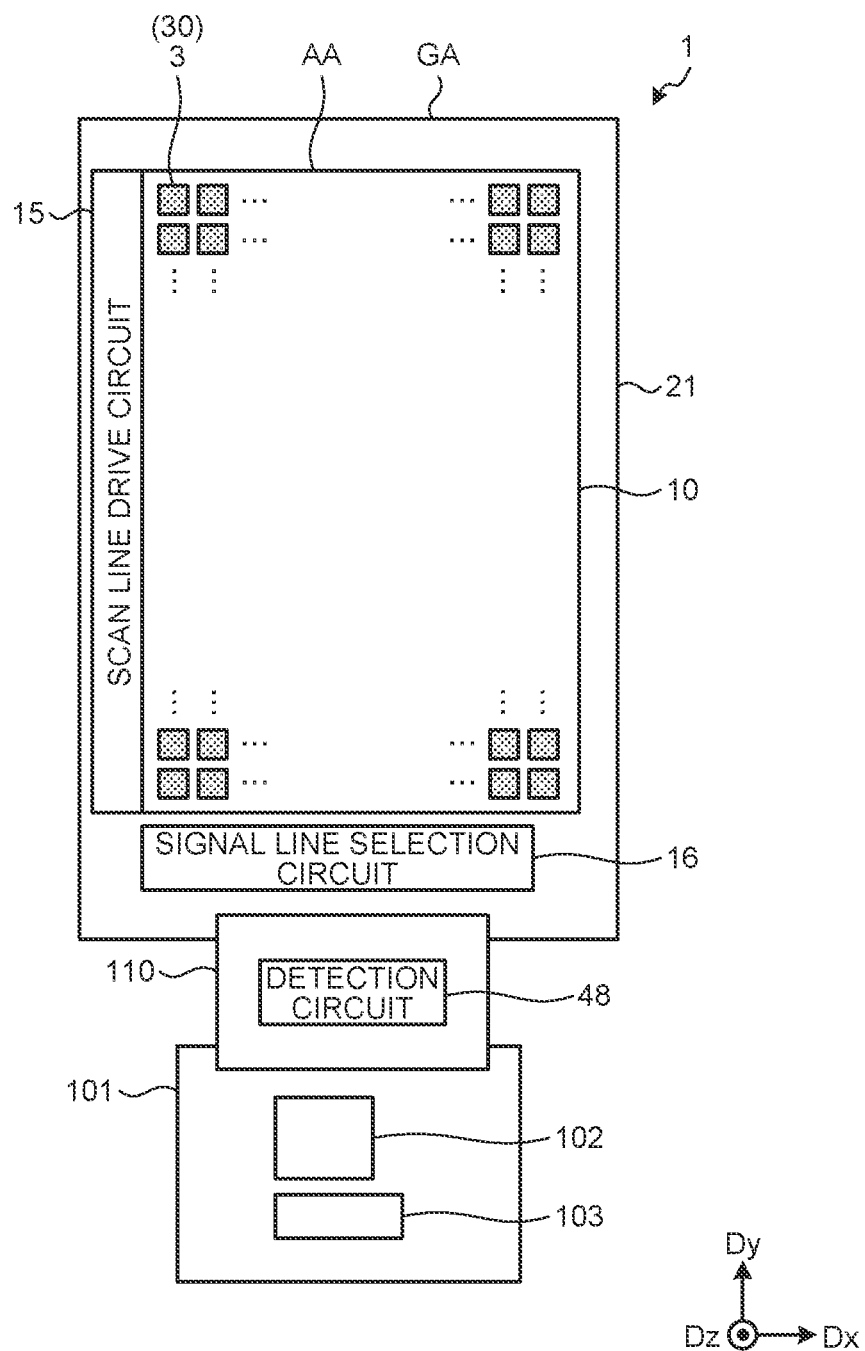
FIG. 2 is a plan view illustrating the detection device according to the embodiments.

FIG. 2 is a plan view illustrating the detection device according to the embodiments. As illustrated in FIG. 2, the detection device 1 includes a substrate 21, a sensor area 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor area 10, the scan line drive circuit 15, and the signal line selection circuit 16 to control a detection operation of the sensor area 10. The power supply circuit 103 supplies voltage signals including, for example, a power supply potential Vsf, a reset potential Vrst, and a reference potential VCOM (refer to FIG. 4) to the sensor area 10, the scan line drive circuit 15, and the signal line selection circuit 16.

The substrate 21 has the detection region AA and a peripheral region GA. The detection region AA is a region overlapping a plurality of detection elements 3 included in the sensor area 10. The peripheral region GA is a region outside the detection region AA, and is a region not overlapping the detection elements 3. That is, the peripheral region GA is a region between the outer perimeter of the detection region AA and the ends of the substrate 21. The scan line drive circuit 15 and the signal line selection circuit 16 are provided in the peripheral region GA.

Each of the detection elements 3 of the sensor area 10 is a photosensor including a photoelectric conversion element 30. The photoelectric conversion element 30 is a photodiode, and outputs an electrical signal corresponding to light irradiating each of the photoelectric conversion elements 30. More specifically, the photoelectric conversion element 30 is a positive-intrinsic-negative (PIN) photodiode. The detection elements 3 are arranged in a matrix having a row-column configuration in the detection region AA. The photoelectric conversion element 30 included in each of the detection elements 3 performs the detection according to gate drive signals (for example, a reset control signal RST and a read control signal RD) supplied from the scan line drive circuit 15. Each of the photoelectric conversion elements 30 outputs the electrical signal corresponding to the light irradiating the photoelectric conversion element 30 as a detection signal Vdet to the signal line selection circuit 16. The detection device 1 detects the information on the living body based on the detection signals Vdet received from the photoelectric conversion elements 30.

The scan line drive circuit 15 and the signal line selection circuit 16 are provided in the peripheral region GA. Specifically, the scan line drive circuit 15 is provided in a region extending along a second direction Dy in the peripheral region GA. The signal line selection circuit 16 is provided in a region extending along a first direction Dx in the peripheral region GA, and is provided between the sensor area 10 and the detection circuit 48.

The first direction Dx is one direction in a plane parallel to the substrate 21. The second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

Figure 3:
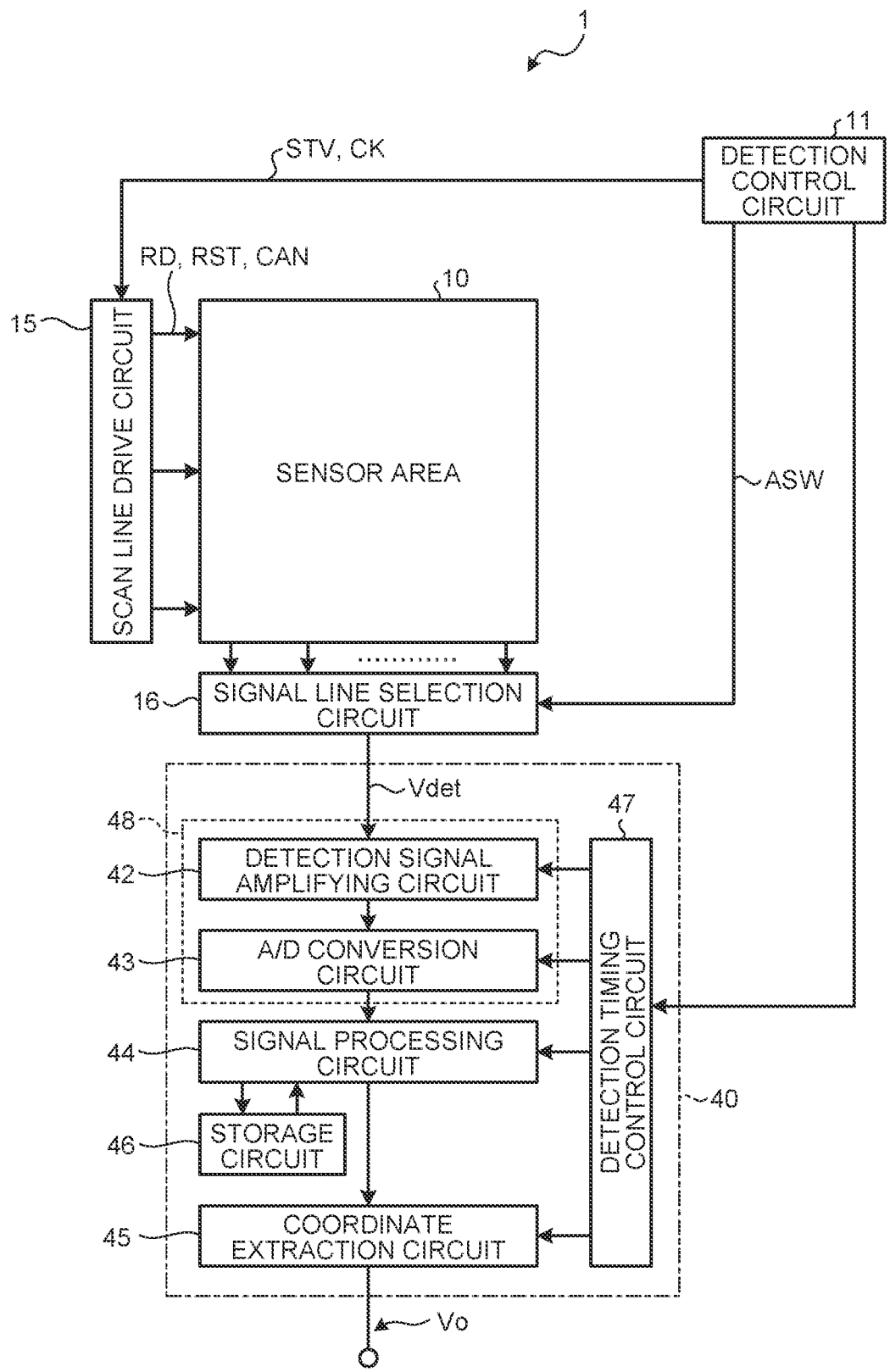
FIG. 3 is a block diagram illustrating a configuration example of the detection device according to the embodiments.

FIG. 3 is a block diagram illustrating a configuration example of the detection device according to the embodiments. As illustrated in FIG. 3, the detection device 1 further includes a detection control circuit 11 and a detector 40 (detection processing circuit). One, some, or all of the functions of the detection control circuit 11 may be included in the control circuit 102. One, some, or all of the functions of the detector 40 other than those of the detection circuit 48 may also be included in the control circuit 102.

The detection control circuit 11 is a circuit that supplies respective control signals to the scan line drive circuit 15, the signal line selection circuit 16, and the detector 40 to control operations thereof. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of gate lines (a read control scan line GLrd, a reset control scan line GLrst, and a cancel control scan line GLcan (refer to FIG. 4)) based on the various control signals. The scan line drive circuit 15 sequentially or simultaneously selects the gate lines, and supplies the gate drive signals (for example, the reset control signal RST, the read control signal RD, and a cancel control signal CAN) to the selected gate lines. Through this operation, the scan line drive circuit 15 selects the photoelectric conversion elements 30 coupled to the gate lines.

Figure 4:
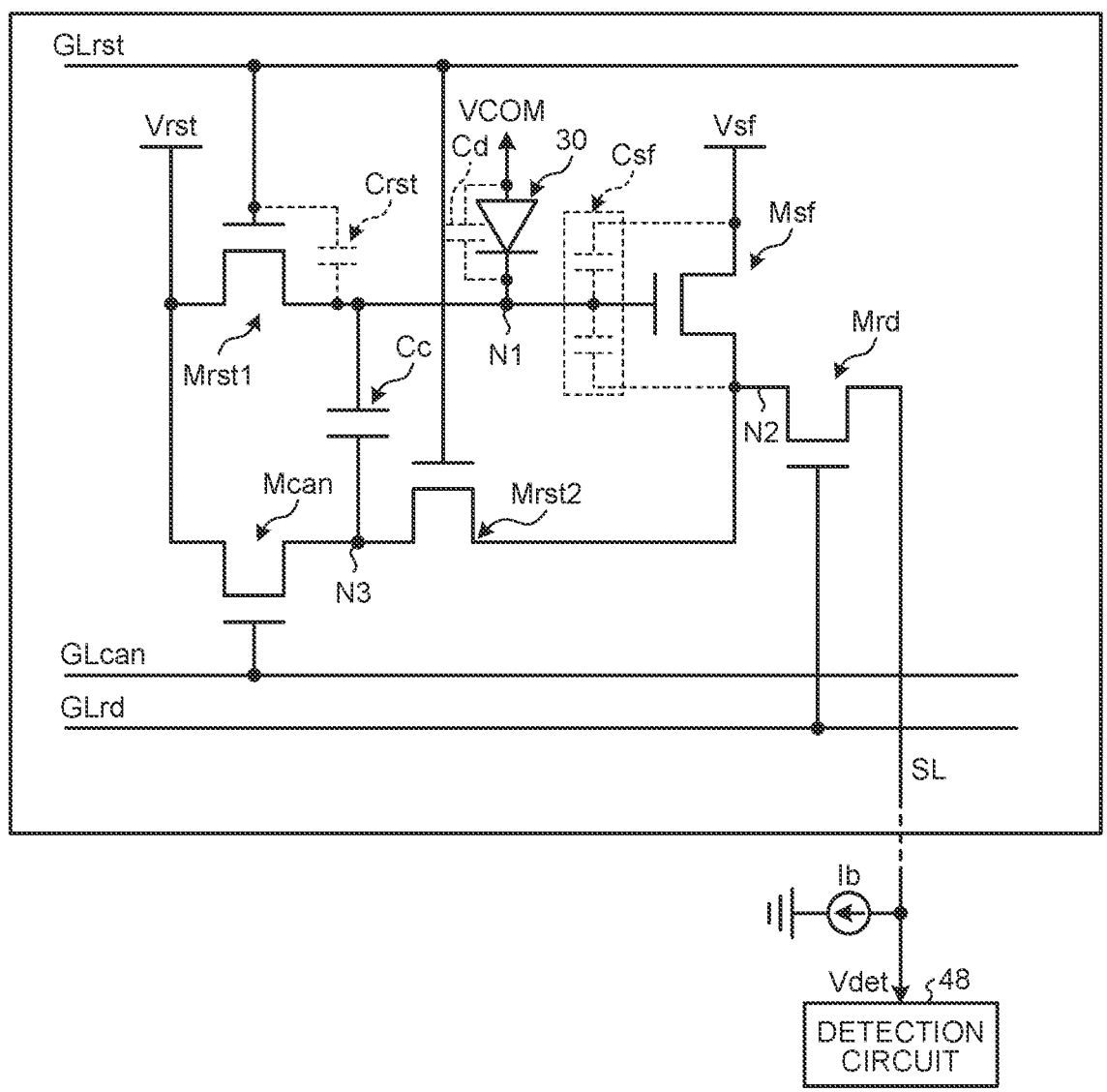
FIG. 4 is a circuit diagram illustrating a detection element according to a comparative example.

The signal line selection circuit 16 is a switching circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signals Vdet of the photoelectric conversion elements 30 to the detector 40. The signal line selection circuit 16 may be omitted. In this case, the output signal lines SL may be directly coupled to the detection circuit 48.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having circuitries of at least a detection signal amplifying circuit 42 and an analog-to-digital (A/D) conversion circuit 43. The detection signal amplifying circuit 42 amplifies the detection signal Vdet. The A/D conversion circuit 43 converts an analog signal output from the detection signal amplifying circuit 42 into a digital signal.

The signal processing circuit 44 is a logic circuit that detects a predetermined physical quantity received by the sensor area 10 based on output signals of the detection circuit 48. The signal processing circuit 44 can detect asperities on the surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include a blood vessel image, a pulse wave, pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor area 10 to generate two-dimensional information representing a shape of the asperities on the surface of the finger Fg or the like. The coordinate extraction circuit 45 may output the detection signals Vdet as sensor outputs Vo instead of calculating the detected coordinates.

COMPARATIVE EXAMPLE

The following describes a circuit configuration example and an operation example of a detection element according to a comparative example. FIG. 4 is a circuit diagram illustrating the detection element according to the comparative example. As illustrated in FIG. 4, the detection element according to the comparative example includes the photoelectric conversion element 30, a capacitive element Cc, a first reset transistor Mrst1, a second reset transistor Mrst2, a cancel transistor Mcan, a read transistor Mrd, and a source follower transistor Msf. The detection element is provided with the reset control scan line GLrst, the read control scan line GLrd, and the cancel control scan line GLcan as detection drive lines, and provided with each of the output signal lines SL as wiring for reading a signal.

A constant-current source is coupled to the output signal line SL to apply a bias current Ib to the read transistor Mrd. This configuration allows the detection element 3 to detect the detection signal Vdet applied to the output signal line SL. The constant-current source may be provided in the detection circuit 48 or in the substrate 21.

While FIG. 4 illustrates one of the detection elements, the reset control scan lines GLrst, the read control scan lines GLrd, the cancel control scan lines GLcan, and the output signal lines SL are coupled to the detection elements. Specifically, the reset control scan lines GLrst, the read control scan lines GLrd, and the cancel control scan lines GLcan extend in the first direction Dx (refer to FIG. 2), and are each coupled to the detection elements arranged in the first direction Dx. The output signal lines SL extend in the second direction Dy, and are each coupled to the detection elements arranged in the second direction Dy.

The first reset transistor Mrst1, the second reset transistor Mrst2, the cancel transistor Mcan, the read transistor Mrd, and the source follower transistor Msf are provided correspondingly to each of the photoelectric conversion elements 30. Each of the transistors included in the detection element is constituted by an n-type thin-film transistor (TFT). However, each of the transistors is not limited thereto, and may be constituted by a p-type TFT.

The reference potential VCOM is applied to the anode of the photoelectric conversion element 30. The cathode of the photoelectric conversion element 30 is coupled to a node N1. The node N1 is coupled to one of the source and the drain of the first reset transistor Mrst1, and to the gate of the source follower transistor Msf. When light irradiates the photoelectric conversion element 30, an electric charge is stored in capacitance Cd of the photoelectric conversion element 30.

The gate of the first reset transistor Mrst1 is coupled to the reset control scan line GLrst. The other of the source and the drain of the first reset transistor Mrst1 is supplied with the reset potential Vrst.

The source follower transistor Msf is coupled between a terminal supplied with the power supply potential Vsf and the read transistor Mrd (node N2). The gate of the source follower transistor Msf is coupled to the node N1. The electric charge stored in the capacitance Cd of the photoelectric conversion element 30 is supplied to the gate of the source follower transistor Msf as a voltage signal. This operation causes the source follower transistor Msf to output the voltage signal corresponding to the electric charge generated by the photoelectric conversion element 30 to the read transistor Mrd.

The read transistor Mrd is coupled between the source of the source follower transistor Msf (node N2) and the output signal line SL. The gate of the read transistor Mrd is coupled to the read control scan line GLrd. When the read transistor Mrd is turned on in response to the read control signal RD, the signal output from the source follower transistor Msf, that is, the voltage signal corresponding to the signal (electric charge) generated by the photoelectric conversion element 30 is output as the detection signal Vdet to the output signal line SL.

The gate of the second reset transistor Mrst2 is coupled to the reset control scan line GLrst. One of the source and the drain of the second reset transistor Mrst2 is coupled to a coupling point (node N2) between the source of the source follower transistor Msf and the read transistor Mrd.

The other of the source and the drain of the second reset transistor Mrst2 is coupled to one of the source and the drain of the cancel transistor Mcan (node N3). The gate of the cancel transistor Mcan is coupled to the cancel control scan line GLcan. The other of the source and the drain of the cancel transistor Mcan is supplied with the reset potential Vrst.

The capacitive element Cc is coupled between the node N1 and the node N3.

Each of the first reset transistor Mrst1 and the source follower transistor Msf has what is called parasitic capacitance. In FIG. 4, Crst denotes the parasitic capacitance of the first reset transistor Mrst1, and Csf denotes the parasitic capacitance of the source follower transistor Msf. The other transistors also have parasitic capacitance. In this comparative example, however, the parasitic capacitance of the second reset transistor Mrst2, the cancel transistor Mcan, and the read transistor Mrd will be omitted.

Figure 6A:
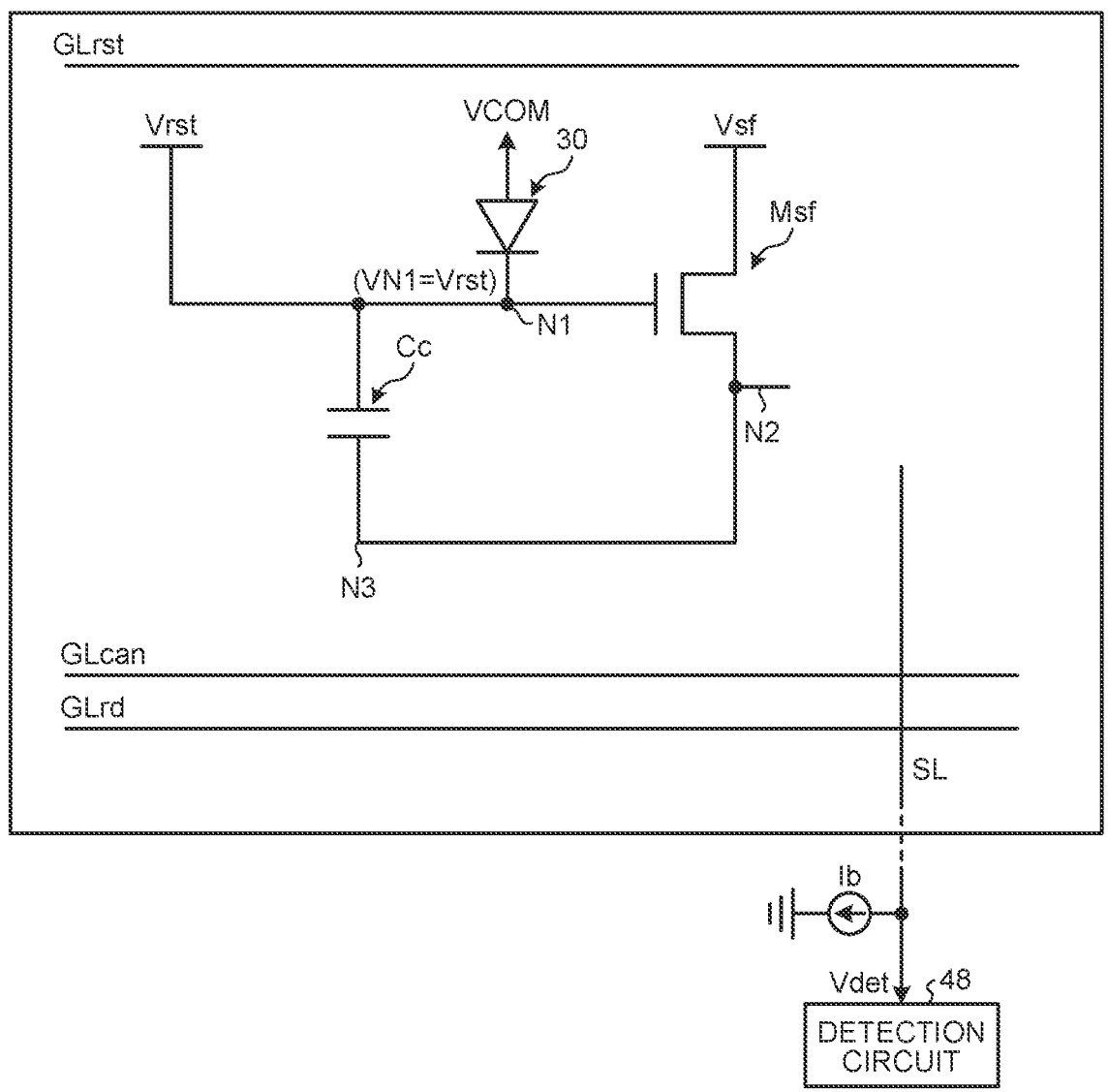
FIG. 6A is a diagram illustrating an equivalent circuit of the detection element during a period t0 to t1 illustrated in FIG. 5.
Figure 6B:
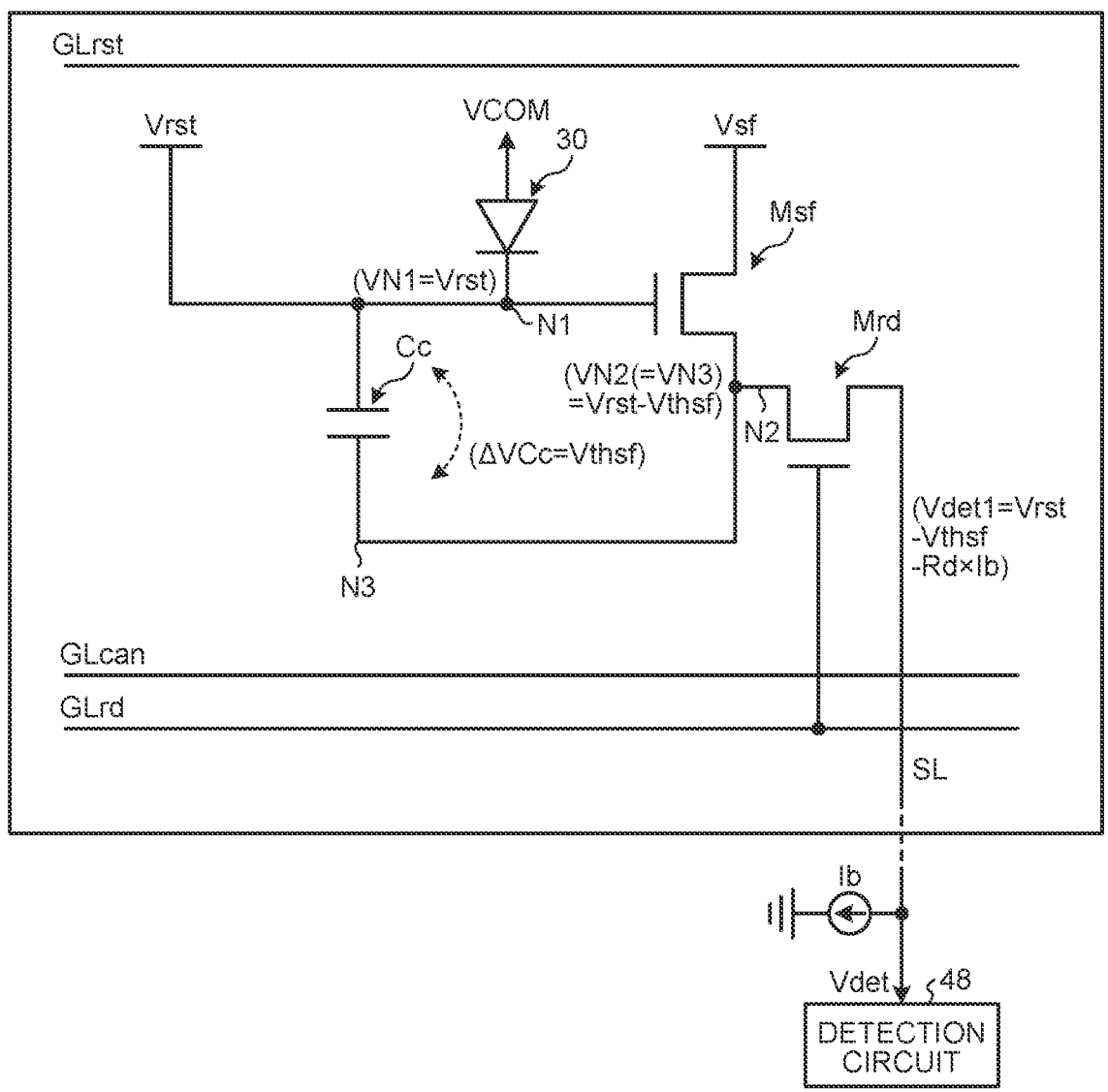
FIG. 6B is a diagram illustrating the equivalent circuit of the detection element during a period t1 to t2 illustrated in FIG. 5.
Figure 6C:
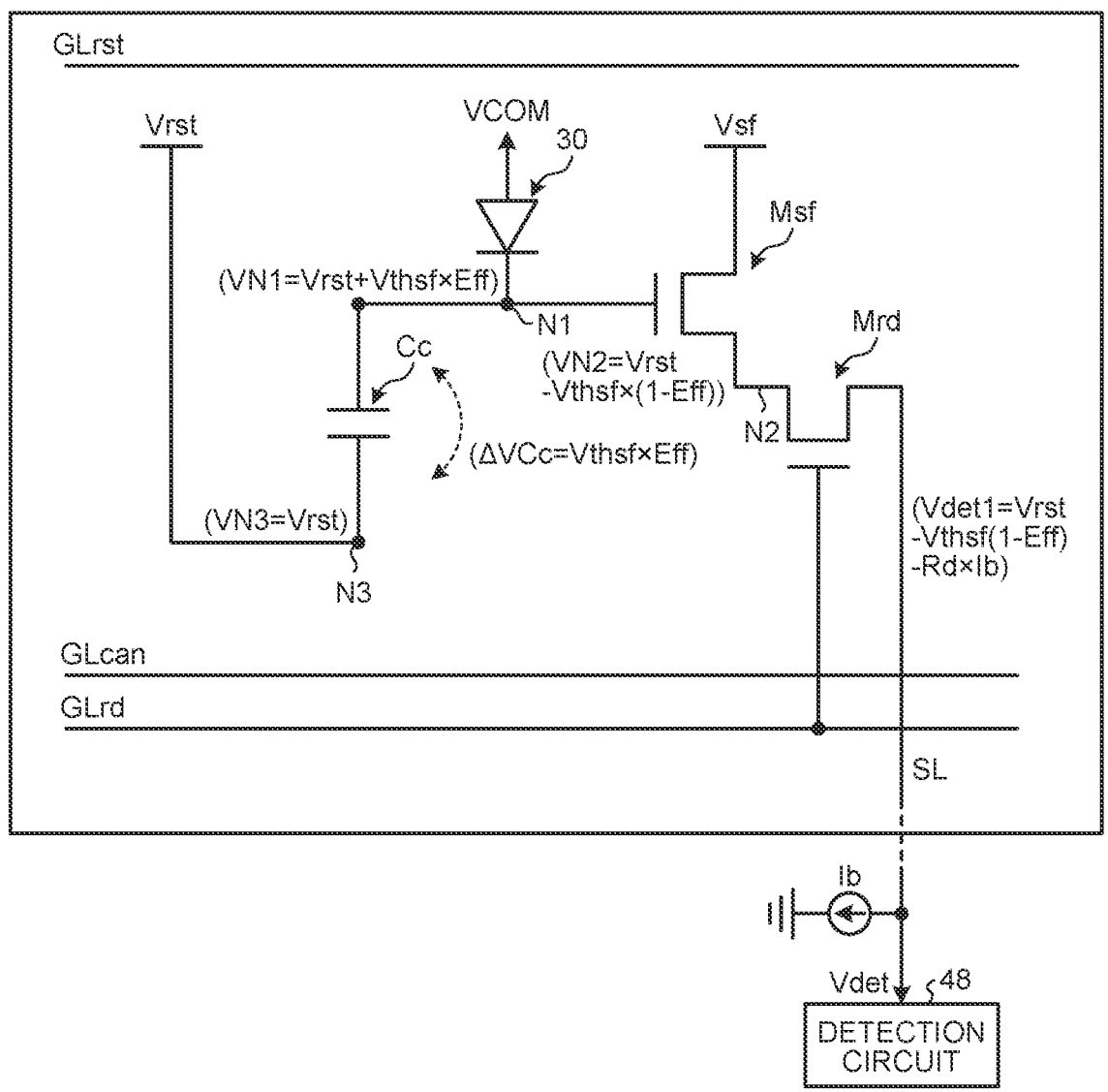
FIG. 6C is a diagram illustrating the equivalent circuit of the detection element during a period t2' to t3 illustrated in FIG. 5.
Figure 6D:
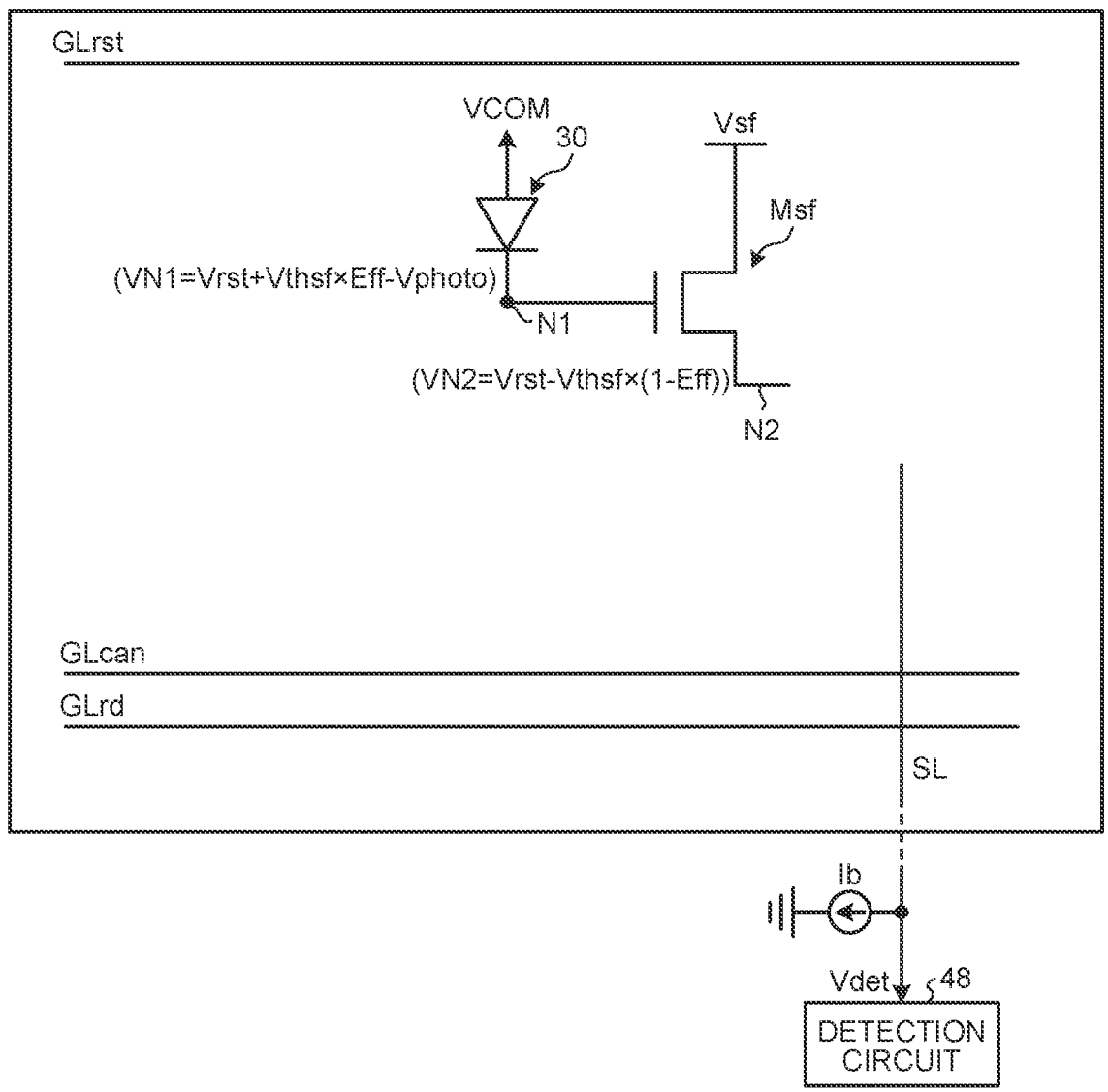
FIG. 6D is a diagram illustrating the equivalent circuit of the detection element during a period t3 to t4 illustrated in FIG. 5.
Figure 6E:
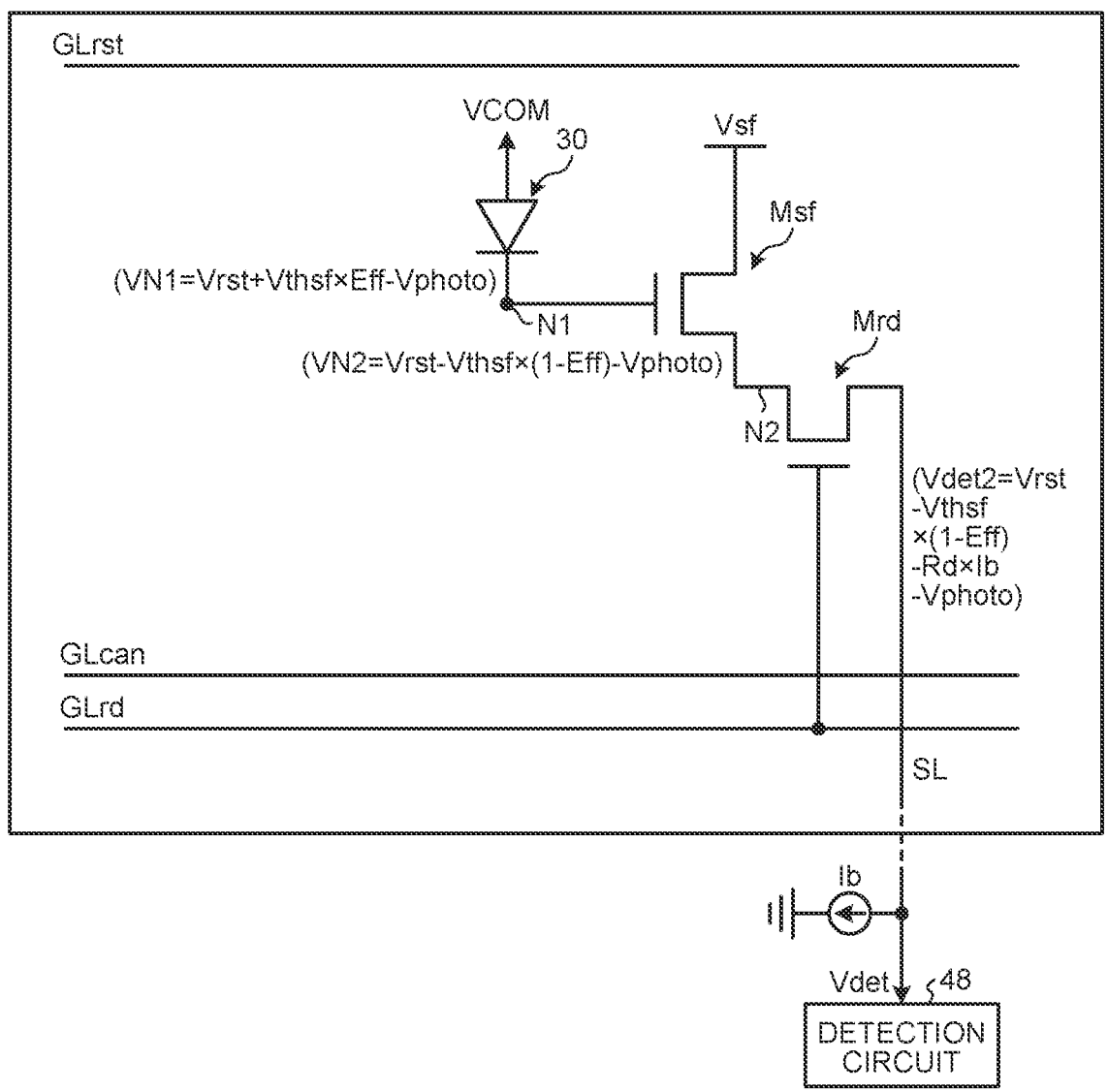
FIG. 6E is a diagram illustrating the equivalent circuit of the detection element during a period t4 to t5 illustrated in FIG. 5.

FIG. 5 is a timing waveform diagram illustrating an operation example of the detection element according to the comparative example. FIG. 6A is a diagram illustrating an equivalent circuit of the detection element during a period t0 to t1 illustrated in FIG. 5. FIG. 6B is a diagram illustrating the equivalent circuit of the detection element during a period t1 to t2 illustrated in FIG. 5. FIG. 6C is a diagram illustrating the equivalent circuit of the detection element during a period t2' to t3 illustrated in FIG. 5. FIG. 6D is a diagram illustrating the equivalent circuit of the detection element during a period t3 to t4 illustrated in FIG. 5. FIG. 6E is a diagram illustrating the equivalent circuit of the detection element during a period t4 to t5 illustrated in FIG. 5.

The detection element performs the detection in the order of a reset period Prst, a storage period Pch, and a read period Pdet. The reset period Prst is a period to set Vdet1 that serves as a reference value for a voltage change amount of the detection signal Vdet corresponding to the light irradiating the photoelectric conversion element 30.

In the configuration of the comparative example illustrated in FIG. 4, the reset control signal RST supplied to the reset control scan line GLrst is set to HIGH (high-level voltage) to start the reset period Prst at time t0. In the reset period Prst, the first reset transistor Mrst1 and the second reset transistor Mrst2 are turned on (into a conduction state). This operation sets a potential VN1 of the node N1 to the reset potential Vrst as represented by Expression (1) below (refer to FIG. 6A).

$$VN1=Vrst \quad (1)$$

At time t1, the read control signal RD supplied to the read control scan line GLrd is set to HIGH (high-level voltage). This operation turns on the read transistor Mrd (into the conduction state). At this time, a potential VN2 of the node N2 (potential VN3 of the node N3) is represented by Expression (2) below (refer to FIG. 6B). In Expression (2) below, Vthsf denotes a threshold voltage of the source follower transistor Msf.

$$VN2(=VN3)=Vrst-Vthsf \quad (2)$$

At this time, the capacitive element Cc provided between the nodes N1 and N3 is charged by a potential difference ΔVCc (Vthsf) represented by Expression (3) below (refer to FIG. 6B).

$$\Delta VCc=Vthsf \quad (3)$$

At this time, the potential Vdet1 of the detection signal Vdet output from the output signal line SL is represented by Expression (4) below (refer to FIG. 6B). In Expression (4) below, Rrd denotes on-resistance of the read transistor Mrd, and Ib denotes the bias current conducted to the read transistor Mrd by the constant-current source. That is, (Rrd× Ib) on the right-hand side of Expression (4) below denotes a voltage drop caused by the on-resistance Rrd of the read transistor Mrd.

$$Vdet1=Vrst-Vthsf-Rrd\times Ib \quad (4)$$

After the reset control signal RST is set to LOW (low-level voltage) at time t2 and the cancel control signal CAN is set to HIGH (high-level voltage) at time t2', the cancel transistor Mcan is turned on (into the conduction state), and the potential VN3 of the node N3 is set to the reset potential Vrst as represented by Expression (5) below (refer to FIG. 6C).

$$VN3=Vrst \quad (5)$$

At this time, the potential VN1 of the node N1 is set, as an initial value, to a potential obtained by superimposing the voltage ΔVCc (=Vthsf×Eff) between both ends of the capacitive element Cc on the potential VN3 (=Vrst) of the node N3, as represented by Expression (6) below (refer to FIG. 6C).

$$VN1=VN3+\Delta VCc=Vrst+Vthsf\times Eff \quad (6)$$

The following describes the coefficient Eff on the right-hand side of Expression (6) above.

During a period from time t2' to time t3, the potential difference between the node N1 and the node N2 is given by the threshold voltage Vthsf of the source follower transistor Msf. At this time, the voltage ΔVCc between both ends of the capacitive element Cc can be represented by Expression (7) below. The coefficient Eff in Expression (6) above can be represented by Expression (8) below.

$$\Delta VCc=Vthsf\times(Cc/(Cc+Crst+Csf+Cd)) \quad (7)$$

$$Eff=Cc/(Cc+Crst+Csf+Cd) \quad (8)$$

As a result, the potential VN2 of the node N2 is set to a value (Vrst−Vthsf×(1−Eff)) obtained by subtracting the threshold voltage Vthsf of the source follower transistor Msf from the potential VN1 (=Vrst+Vthsf×Eff) of the node N1, as represented by Expression (9) below, and the potential Vdet1 of the detection signal Vdet output from the output signal line SL is set to a value obtained by subtracting the voltage drop (=Rrd×Ib) caused by the on-resistance Rrd of the read transistor Mrd from the potential VN2 (=Vrst+Rrd× Ib) of the node N2, as represented by Expression (10) below.

$$VN2=VN1-Vthsf=(Vrst+Vthsf\times Eff)-Vthsf=Vrst-Vthsf\times(1-Eff) \quad (9)$$

$$Vdet1=VN2-Rrd\times Ib=Vrst-Vthsf\times(1-Eff)-Rrd\times Ib \quad (10)$$

At time t3, the read control signal RD and the cancel control signal CAN are set to LOW (low-level voltage) to end the reset period Prst and start the storage period Pch. At this time, the read transistor Mrd and the cancel transistor Mcan are turned off (into a non-conduction state) to set the potential VN2 of the node N2 to be constant at (Vrst−Vthsf×

(1−Eff)) represented by Expression (9) above (refer to FIG. 6D). The potential of the detection signal Vdet output from the output signal line SL is set to LOW (low-level voltage). The potential VN1 of the node N1 decreases by a voltage change amount Vphoto corresponding to the light irradiating the photoelectric conversion element 30, as represented by Expression (11) below (refer to FIG. 6D).

$$VN1 = Vrst + Vthsf \times Eff - Vphoto \quad (11)$$

When the read control signal RD is set to HIGH (high-level voltage) at time t4, the read transistor Mrd is turned on (into the conduction state) to end the storage period Pch and start the read period Pdet. The potential VN2 of the node N2 decreases by the voltage change amount Vphoto corresponding to the light irradiating the photoelectric conversion element 30, as represented by Expression (12) below (refer to FIG. 6E).

$$VN2 = Vrst - Vthsf \times (1-Eff) - Vphoto \quad (12)$$

At this time, the potential Vdet2 of the detection signal Vdet output in the read period Pdet is set to a value obtained by subtracting the voltage drop (Rrd×Ib) caused by the on-resistance Rrd of the read transistor Mrd from the potential VN2 (=Vrst−Vthsf×(1−Eff)−Vphoto) of the node N2, as represented by Expression (13) below (refer to FIG. 6E).

$$Vdet2 = VN2 - Rrd \times Ib = Vrst - Vthsf \times (1-Eff) Rrd \times Ib - Vphoto \quad (13)$$

At time t5, the read control signal RD is set to LOW (low-level voltage) to end the read period Pdet.

The detector 40 detects the potential Vdet2 of the detection signal Vdet at time t5 when the read period Pdet ends. While FIG. 5 illustrates the operation example of one of the detection elements, the scan line drive circuit 15 sequentially scans the reset control scan lines GLrst, the read control scan lines GLrd, and the cancel control scan lines GLcan in a time-division manner. The detection elements in the entire detection region AA can perform the detection processing by repeating this procedure.

In Expression (13) above, if the coefficient Eff given in Expression (5) above can be approximated to one, the term of the threshold voltage Vthsf of the source follower transistor Msf can be regarded as "0". However, in the configuration using the photoelectric conversion element 30, the light-receiving area of the photoelectric conversion element 30 needs to be increased to improve the detection performance.

First Embodiment

The following describes a circuit configuration example and an operation example of the detection device 1 according to a first embodiment of the present invention. The description will focus on differences from the comparative example.

Figure 7:
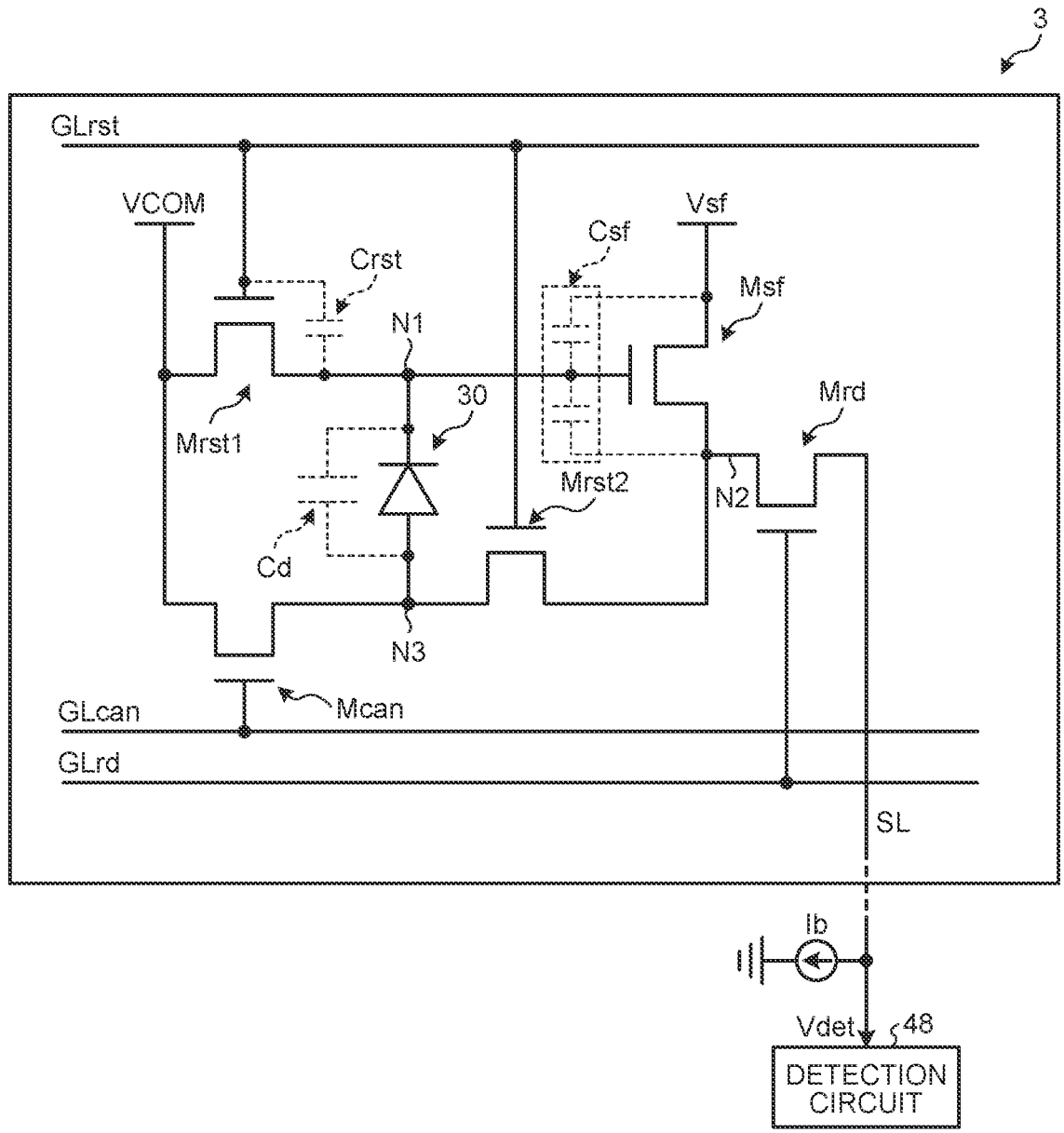
FIG. 7 is a circuit diagram illustrating the detection element according to a first embodiment of the present invention.

FIG. 7 is a circuit diagram illustrating the detection element according to the first embodiment. As illustrated in FIG. 7, in the configuration of the first embodiment, the photoelectric conversion element 30 is provided between the node N1 and the node N3. The anode of the photoelectric conversion element 30 is coupled to the node N3. The cathode of the photoelectric conversion element 30 is coupled to the node N1. When the light irradiates the photoelectric conversion element 30, the signal (electric charge) output from the photoelectric conversion element 30 is stored in the capacitance Cd of the photoelectric conversion element 30.

The gate of the first reset transistor Mrst1 is coupled to the reset control scan line GLrst. The other of the source and the drain of the first reset transistor Mrst1 is supplied with the reference potential VCOM.

The other of the source and the drain of the second reset transistor Mrst2 is coupled to the one of the source and the drain of the cancel transistor Mcan (node N3). The gate of the cancel transistor Mcan is coupled to the cancel control scan line GLcan. The other of the source and the drain of the cancel transistor Mcan is supplied with the reference potential VCOM.

Each of the first reset transistor Mrst1 and the source follower transistor Msf has what is called parasitic capacitance in the same manner as in the comparative example described above. In FIG. 7, Crst denotes the parasitic capacitance of the first reset transistor Mrst1, and Csf denotes the parasitic capacitance of the source follower transistor Msf. The other transistors also have parasitic capacitance. In this example, however, the parasitic capacitance of the second reset transistor Mrst2, the cancel transistor Mcan, and the read transistor Mrd are omitted.

In the example illustrated in FIG. 7, each of the first reset transistor Mrst1 and the read transistor Mrd has what is called a single-gate structure, but is not limited thereto, and may have what is called a double-gate structure constituted by two transistors coupled in series, or may have three or more transistors coupled in series. The circuit of each of the detection elements 3 is not limited to the configuration including the five transistors of the first reset transistor Mrst1, the second reset transistor Mrst2, the cancel transistor Mcan, the source follower transistor Msf, and the read transistor Mrd. The detection element 3 may include six or more transistors.

The present embodiment has the configuration including the capacitance Cd of the photoelectric conversion element 30 instead of the capacitive element Cc illustrated in FIG. 4 of the comparative example described above. As described above, in the configuration using the photoelectric conversion element 30, the light-receiving area of the photoelectric conversion element 30 needs to be increased to improve the detection performance. As a result, the capacitance Cd of the photoelectric conversion element 30 can be made sufficiently larger than the parasitic capacitance Crst of the first reset transistor Mrst1 and the parasitic capacitance Csf of the source follower transistor Msf. The following specifically describes effects of the configuration of the present embodiment illustrated in FIG. 7, with reference to FIGS. 8A, 8B, and 9A to 9F.

Figure 9A:
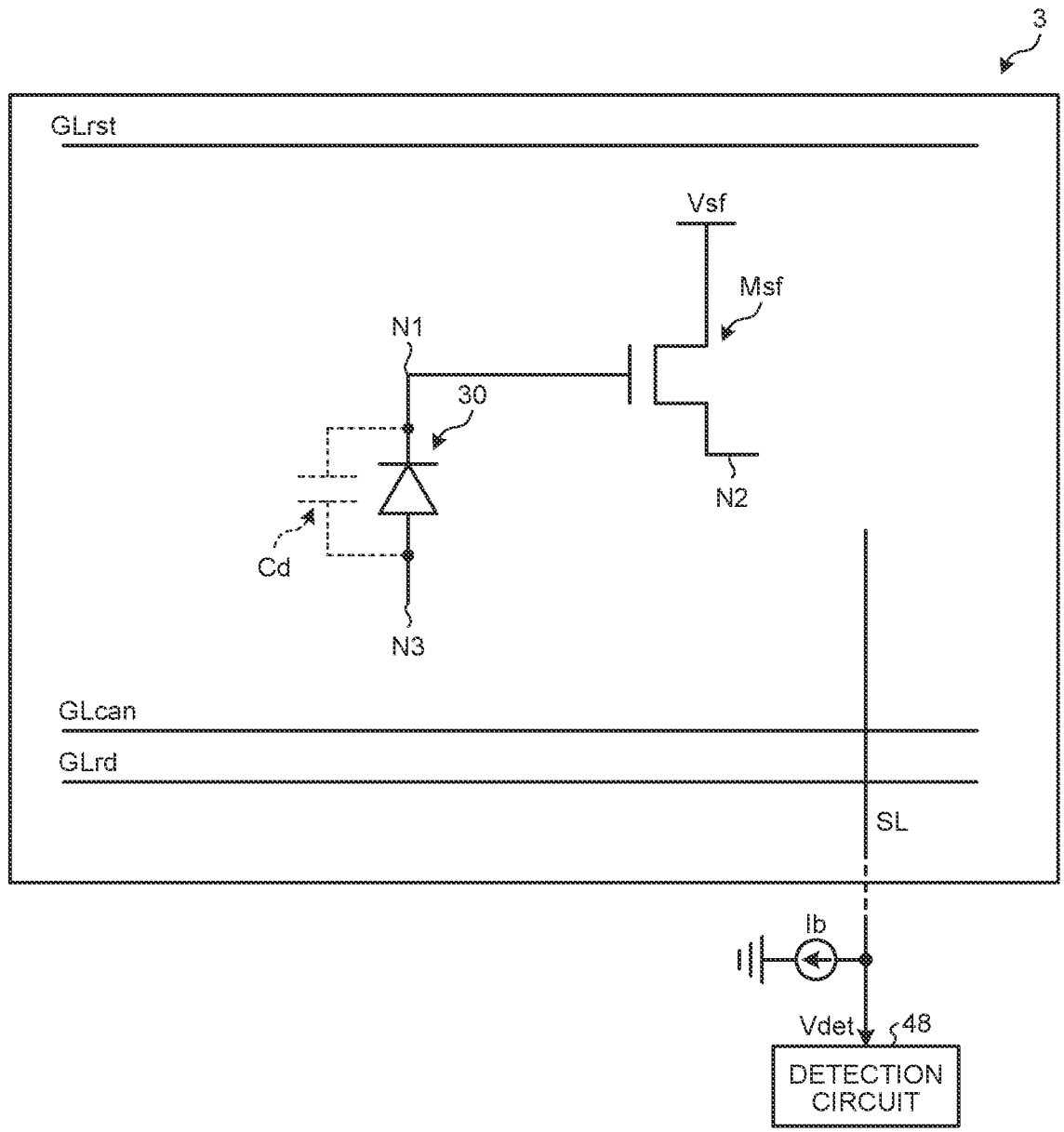
FIG. 9A is a diagram illustrating the equivalent circuit of the detection element during a period t0 to t0' illustrated in FIGS. 8A and 8B.
Figure 9B:
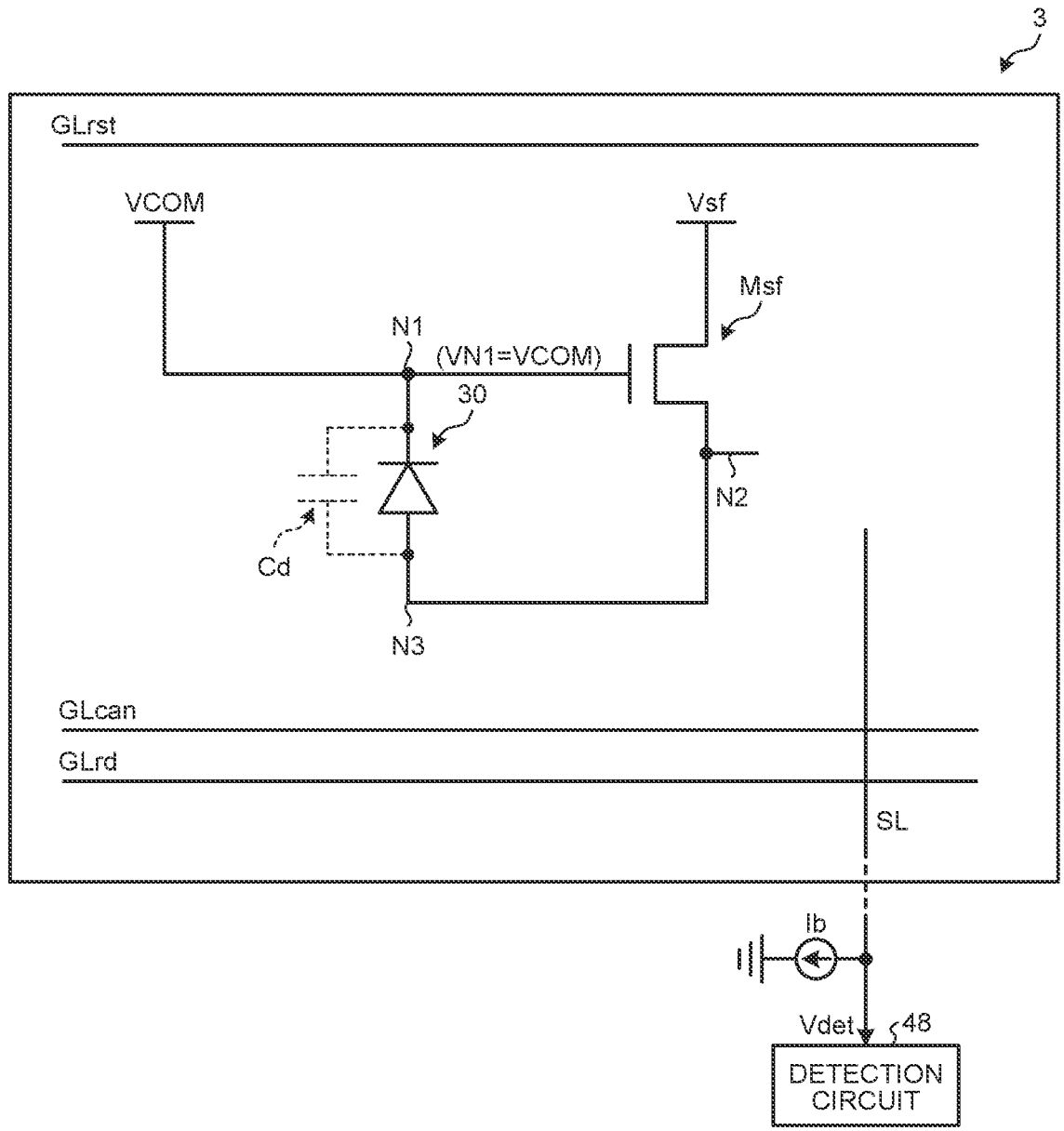
FIG. 9B is a diagram illustrating the equivalent circuit of the detection element during a period t0' to t1 illustrated in FIGS. 8A and 8B.
Figure 9C:
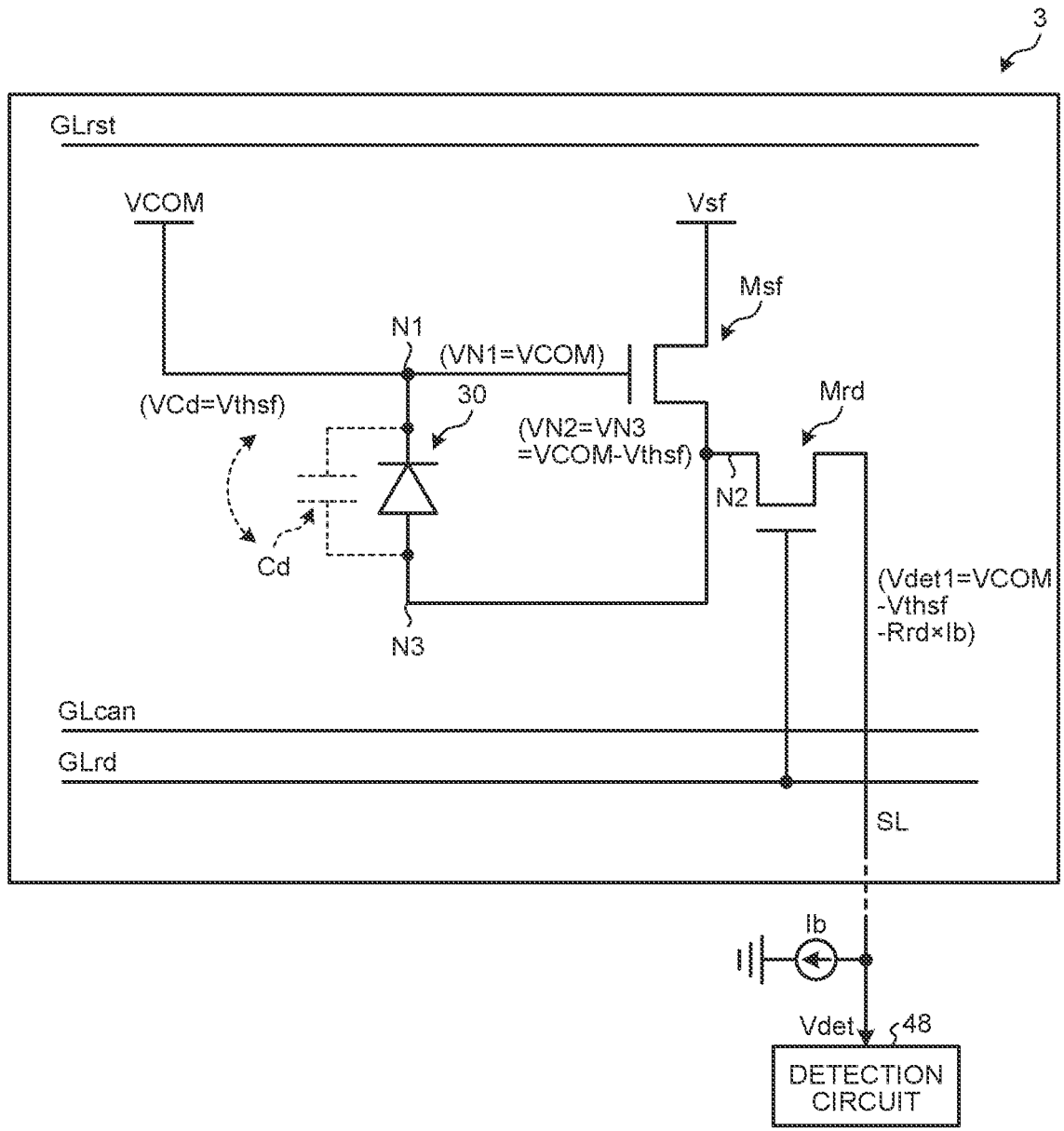
FIG. 9C is a diagram illustrating the equivalent circuit of the detection element during the period t1 to t2 illustrated in FIGS. 8A and 8B.
Figure 9D:
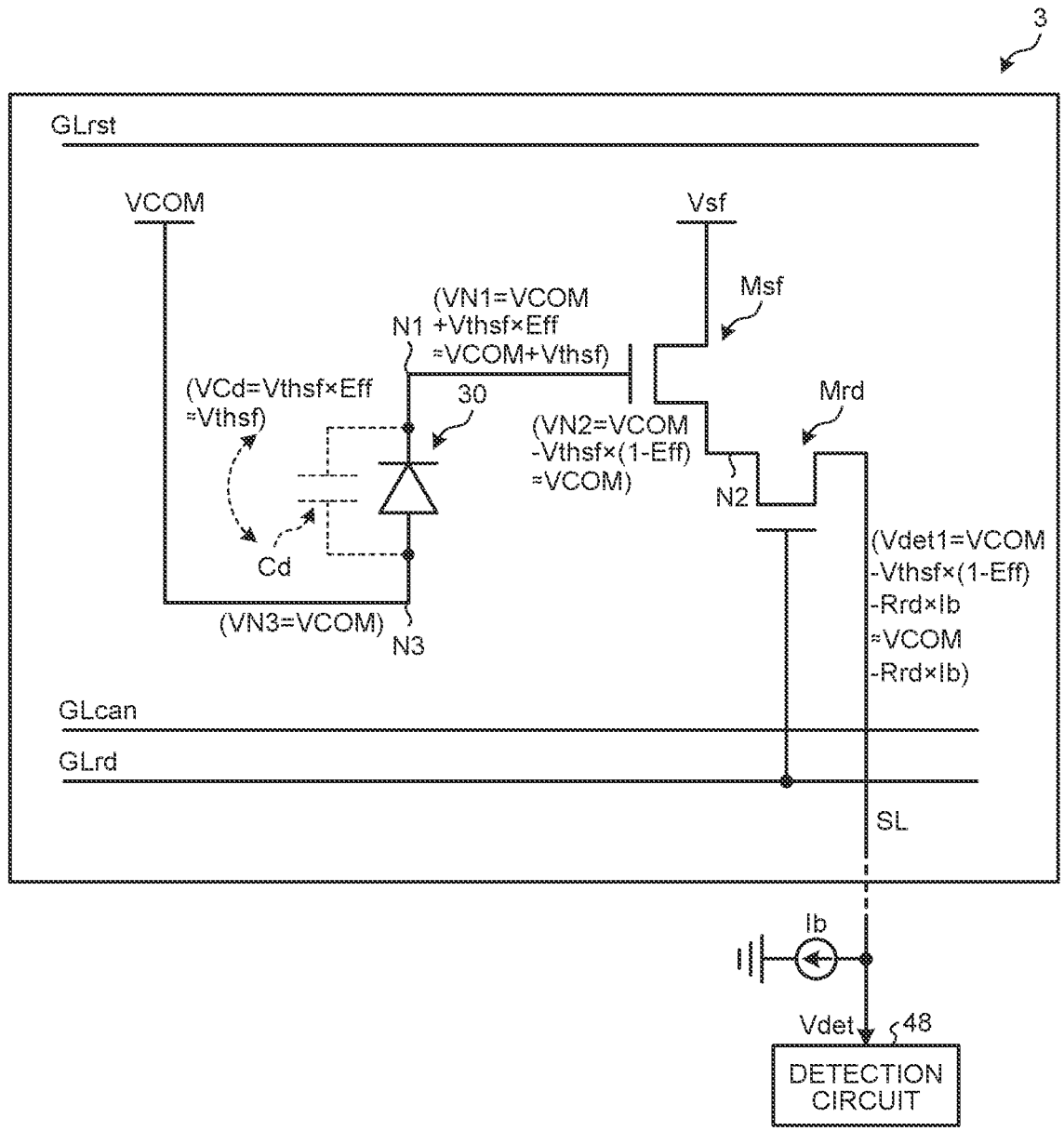
FIG. 9D is a diagram illustrating the equivalent circuit of the detection element during the period t2' to t3 illustrated in FIGS. 8A and 8B.
Figure 9E:
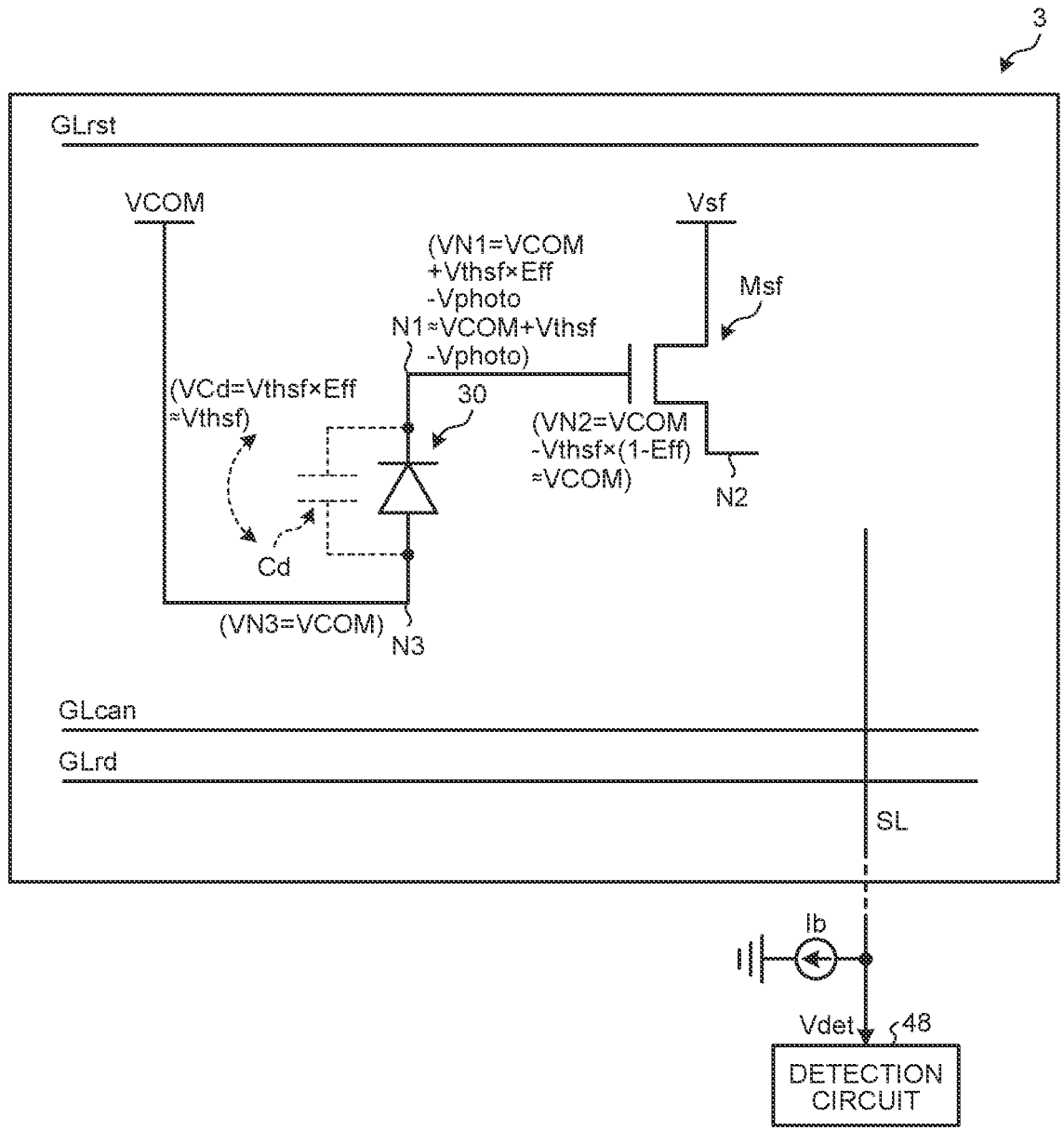
FIG. 9E is a diagram illustrating the equivalent circuit of the detection element during the period t3 to t4 illustrated in FIGS. 8A and 8B.
Figure 9F:
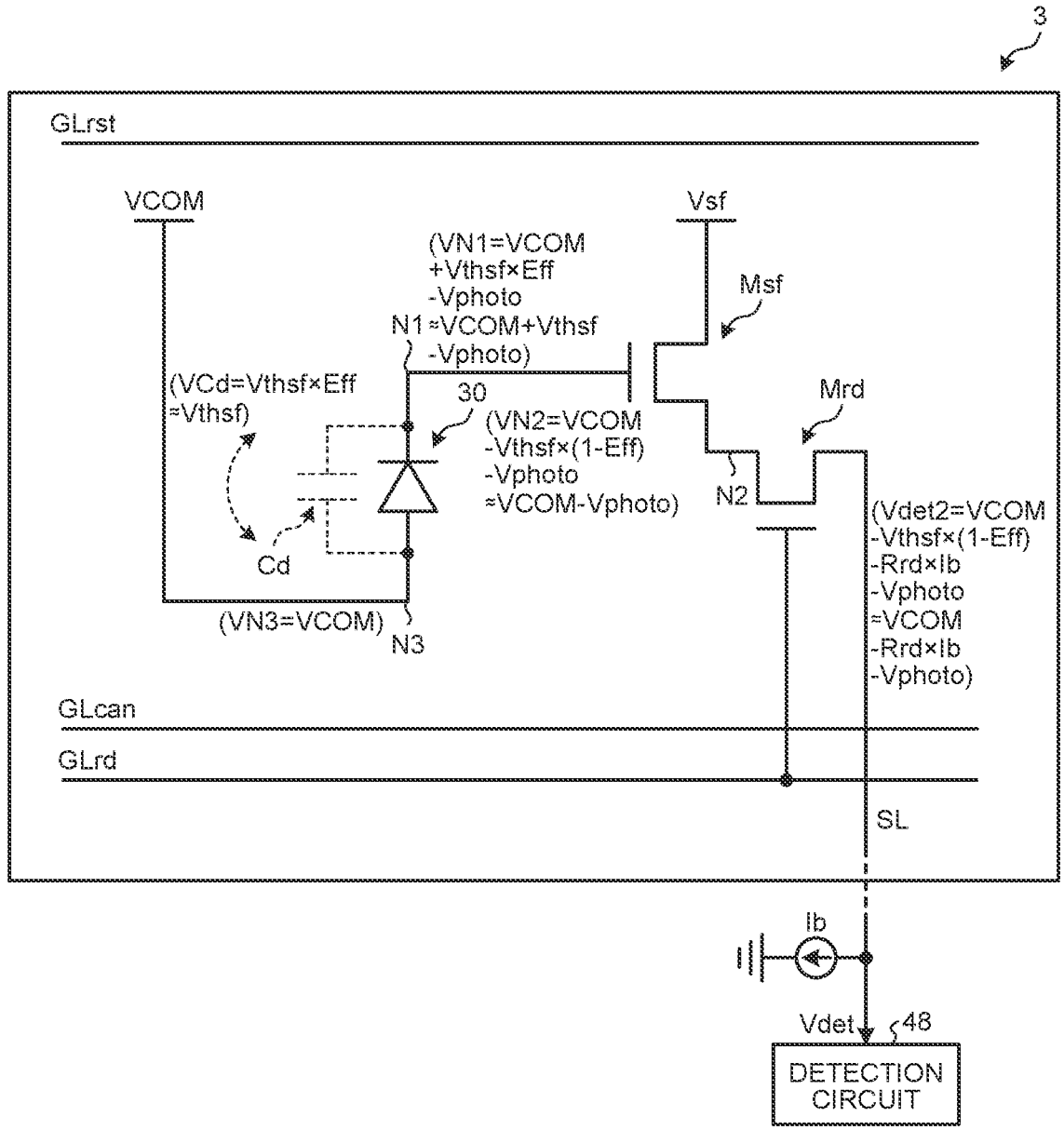
FIG. 9F is a diagram illustrating the equivalent circuit of the detection element during the period t4 to t5 illustrated in FIGS. 8A and 8B.

FIGS. 8A and 8B are timing waveform diagrams illustrating operation examples of the detection element according to the first embodiment. FIG. 8A illustrates a timing waveform diagram when the parasitic capacitance Crst of the first reset transistor Mrst1 and the parasitic capacitance Csf of the source follower transistor Msf are not ignored. FIG. 8B illustrates a timing waveform diagram when the parasitic capacitance Crst of the first reset transistor Mrst1 and the parasitic capacitance Csf of the source follower transistor Msf are ignored. FIG. 9A is a diagram illustrating the equivalent circuit of the detection element during a period t0 to t0' illustrated in FIGS. 8A and 8B. FIG. 9B is a diagram illustrating the equivalent circuit of the detection element during a period to, to t1 illustrated in FIGS. 8A and 8B. FIG. 9C is a diagram illustrating the equivalent circuit of the detection element during the period t1 to t2 illustrated in FIGS. 8A and 8B. FIG. 9D is a diagram illustrating the equivalent circuit of the detection element during the period t2' to t3 illustrated in FIGS. 8A and 8B. FIG. 9E is a diagram illustrating the equivalent circuit of the detection element during the period t3 to t4 illustrated in FIGS. 8A and 8B. FIG. 9F is a diagram illustrating the equivalent circuit of the detection element during the period t4 to t5 illustrated in FIGS. 8A and 8B.

The following describes the case where the parasitic capacitance Crst and the parasitic capacitance Csf of the first reset transistor Mrst1 and the source follower transistor Msf are not ignored (refer to FIG. 8A), and describes, where appropriate, the case where the parasitic capacitance Crst and the parasitic capacitance Csf of the first reset transistor Mrst1 and the source follower transistor Msf are ignored (refer to FIG. 8B).

The detection element 3 performs the detection in the order of the reset period Prst, the storage period Pch, and the read period Pdet. The power supply circuit 103 supplies the reference potential VCOM to the detection element 3 over the reset period Prst, the storage period Pch, and the read period Pdet.

At time t0, the control circuit 102 sets the cancel control signal CAN supplied to the cancel control scan line to LOW (low-level voltage) (refer to FIG. 9A). This operation turns off the cancel transistor Mcan (into the non-conduction state).

Subsequently, at time t0', the control circuit 102 sets the reset control signal RST supplied to the reset control scan line GLrst to HIGH (high-level voltage). This operation starts the reset period Prst. In the reset period Prst, the first reset transistor Mrst1 and the second reset transistor Mrst2 are turned on (into the conduction state). This operation sets the potential VN1 of the node N1 to the reference potential VCOM, as represented by Expression (14) below (refer to FIG. 9B).

$$VN1 = VCOM \tag{14}$$

At time t1, the control circuit 102 sets the read control signal RD supplied to the read control scan line GLrd to HIGH (high-level voltage). This operation turns on the read transistor Mrd (into the conduction state). At this time, the potential VN2 of the node N2 (potential VN3 of the node N3) is represented by Expression (15) below (refer to FIG. 9C).

$$VN2(=VN3)=VCOM-Vthsf \tag{15}$$

At this time, the capacitance Cd of the photoelectric conversion element 30 provided between the nodes N1 and N3 is charged by the threshold voltage Vthsf of the source follower transistor Msf. At this time, a voltage ΔVCd between both ends of the capacitance Cd of the photoelectric conversion element 30 can be represented by Expression (16) below (refer to FIG. 9C).

$$\Delta VCd = Vthsf \tag{16}$$

At this time, the potential Vdet1 of the detection signal Vdet output from the output signal line SL is represented by Expression (17) below (refer to FIG. 9C).

$$Vdet1 = VCOM - Vthsf - Rrd \times Ib \tag{17}$$

The control circuit 102 sets the reset control signal RST to LOW (low-level voltage) at time t2, and sets the cancel control signal CAN to HIGH (high-level voltage) at time t2'. This operation turns on the cancel transistor Mcan (into the conduction state) to set the potential VN3 of the node N3 to the reference potential VCOM, as represented by Expression (18) below (refer to FIG. 9D).

$$VN3 = VCOM \tag{18}$$

At this time, the voltage ΔVCd between both ends of the capacitance Cd of the photoelectric conversion element 30 can be represented by Expression (19) below.

$$\Delta VCd = Vthsf \times (Cd/(Cd+Crst+Csf)) \tag{19}$$

When the term for the capacitance in Expression (19) above is expressed using the coefficient Eff represented by Expression (20) below, Expression (19) above can be expressed as Expression (21) below (refer to FIG. 9D).

$$Eff = Cd/(Cd+Crst+Csf) \tag{20}$$

$$\Delta VCd = Vthsf \times Eff \tag{21}$$

The potential VN1 of the node N1 is set, as the initial value, to a potential obtained by superimposing the voltage ΔVCd (=Vthsf×Eff) between both ends of the capacitance Cd of the photoelectric conversion element 30 on the potential VN3 (=VCOM) of the node N3, as represented by Expression (22) below (refer to FIG. 9D).

$$VN1 = VN3 + \Delta VCd = VCOM + Vthsf \times Eff \tag{22}$$

When the parasitic capacitance Crst and the parasitic capacitance Csf of the first reset transistor Mrst1 and the source follower transistor Msf are ignored, Expression (20) above can be transformed into Expression (23) below. That is, in the configuration of FIG. 7 according to the present embodiment, the coefficient Eff in Expression (21) above can be approximated to one. As a result, Expression (21) above can be transformed into Expression (24) below.

$$Eff \approx Cd/Cd = 1 \tag{23}$$

$$\Delta VCd \approx Vthsf \tag{24}$$

As a result, Expression (22) above can be transformed into Expression (25) below.

$$VN1 \approx VCOM + Vthsf \tag{25}$$

The potential VN2 of the node N2 is set to a value (VCOM−Vthsf×(1−Eff)) obtained by subtracting the threshold voltage Vthsf of the source follower transistor Msf from the potential VN1 (=VCOM+Vthsf×Eff) of the node N1, as represented by Expression (26) below, and the potential Vdet1 of the detection signal Vdet output from the output signal line SL is set to a value obtained by subtracting the voltage drop (=Rrd×Ib) caused by the on-resistance Rrd of the read transistor Mrd from the potential VN2 (=VCOM−Vthsf×(1−Eff)) of the node N2, as represented by Expression (27) below.

$$VN2 = VN1 - Vthsf = (VCOM + Vthsf \times Eff) - Vthsf = VCOM + Vthsf \times (1-Eff) \tag{26}$$

$$Vdet1 = VN2 - Rrd \times Ib = VCOM - Vthsf \times (1-Eff) - Rrd \times Ib \tag{27}$$

When the coefficient Eff is approximated to one, Vthsf× (1−Eff) illustrated in FIG. 8A can be regarded as zero (Vthsf×(1−Eff)≈0). As a result, Expressions (26) and (27) above can be transformed into Expressions (28) and (29) below.

$$VN2 \approx VCOM \tag{28}$$

$$Vdet1 \approx VCOM - Rrd \times Ib \tag{29}$$

At time t3, the control circuit 102 sets the read control signal RD to LOW (low-level voltage). This operation ends the reset period Prst and starts the storage period Pch. At this time, the read transistor Mrd is turned off (into the non-conduction state) to set the potential VN2 of the node N2 to be constant at (VCOM−Vthsf×(1−Eff) (≈VCOM)) represented by Expression (28) above (refer to FIG. 9E). The potential of the detection signal Vdet output from the output signal line SL is set to LOW (low-level voltage). The potential VN1 of the node N1 is reduced by the voltage change amount Vphoto in response to the light irradiating the photoelectric conversion element 30, as represented by Expression (30) below (refer to FIG. 9E).

$$VN1=VCOM+Vthsf \times \mathit{Eff} - Vphoto (\approx VCOM+Vthsf-Vphoto) \qquad (30)$$

At time t4, the control circuit 102 sets the read control signal RD to HIGH (high-level voltage). As a result, the read transistor Mrd is turned on (into the conduction state) to end the storage period Pch and start the read period Pdet. The potential VN2 of the node N2 is reduced by the voltage change amount Vphoto in response to the light irradiating the photoelectric conversion element 30, as represented by Expression (31) below (refer to FIG. 9F).

$$VN2=VCOM-Vthsf \times (1-\mathit{Eff})-Vphoto(\approx VCOM-Vphoto) \qquad (31)$$

At this time, the potential Vdet2 of the detection signal Vdet output in the read period Pdet is set to a value obtained by subtracting the voltage drop (Rrd×Ib) caused by the on-resistance Rrd of the read transistor Mrd from the potential VN2 (=VCOM−Vthsf×(1−Eff)−Vphoto (≈VCOM−Vphoto)) of the node N2, as represented by Expression (32) below (refer to FIG. 9F).

$$Vdet2=VN2-Rrd \times Ib=VCOM-Vthsf \times (1-\mathit{Eff})-Rrd \times Ib- Vphoto(\approx VCOM-Rrd \times Ib- Vphoto) \qquad (32)$$

At time t5, the control circuit 102 sets the read control signal RD to LOW (low-level voltage). This operation ends the read period Pdet.

The detector 40 detects the potential Vdet2 of the detection signal Vdet at time t5 when the read period Pdet ends. While FIGS. 8A and 8B illustrate the operation examples of one of the detection elements 3, the scan line drive circuit 15 sequentially scans the reset control scan lines GLrst, the read control scan lines GLrd, and the cancel control scan lines GLcan in a time-division manner. The detection elements 3 in the entire detection region AA can perform the detection processing by repeating this procedure.

As described above, the present embodiment is effective when the capacitance Cd of the photoelectric conversion element 30 is unignorably large as compared with the capacitive element Cc illustrated in FIG. 4 of the comparative example described above. In such a case, the capacitance Cd of the photoelectric conversion element 30 has a sufficiently large value as compared with the parasitic capacitance Crst and the parasitic capacitance Csf of the first reset transistor Mrst1 and the source follower transistor Msf. As a result, the coefficient Eff given in Expression (21) above can be approximated to one, as represented by Expression (23) above, and the voltage ΔVCd between both ends of the capacitance Cd of the photoelectric conversion element 30 can be represented as Expression (24) above. Therefore, the term of the threshold voltage Vthsf of the source follower transistor Msf in Expression (32) above can be regarded as "0", and thus, Expression (33) below is obtained.

$$Vdet2=VCOM-Rrd \times Ib- Vphoto \qquad (33)$$

As a result, the potential Vdet2 of the detection signal Vdet output during the read period Pdet illustrated in FIGS. 8A and 8B can cancel the threshold voltage Vthsf of the source follower transistor Msf that serves as a lowering factor of the detection accuracy of the light irradiating the photoelectric conversion element 30, and thus, can improve the detection accuracy of the light irradiating the photoelectric conversion element 30.

As described above, the detection device 1 according to the first embodiment includes the first reset transistor Mrst1 that supplies or interrupts the reference potential VCOM to the cathode of the photoelectric conversion element 30, the second reset transistor Mrst2 that electrically couples or decouples between the anode of the photoelectric conversion element 30 and the coupling point between the source follower transistor Msf and the read transistor Mrd, and the cancel transistor Mcan that supplies or interrupts the reference potential VCOM to the anode of the photoelectric conversion element 30, and sets the potential (=VCOM+Vthsf) obtained by superimposing at least the threshold voltage Vthsf of the source follower transistor Msf on the reference potential VCOM, as the initial value of the potential applied to the cathode of the photoelectric conversion element 30.

In the above-described configuration, during the reset period Prst, the first reset transistor Mrst1 and the second reset transistor Mrst2 are controlled to be turned on, and then, the read transistor Mrd is controlled to be turned on to charge the capacitance Cd of the photoelectric conversion element 30 by the potential difference (=Vthsf) between the input and the output of the source follower transistor Msf, and further, the first reset transistor Mrst1 and the second reset transistor Mrst2 are controlled to be turned off, and the cancel transistor Mcan is controlled to be turned on to set the potential (=VCOM+Vthsf) obtained by superimposing the voltage (=Vthsf) between both ends of the capacitance Cd of the photoelectric conversion element 30 on the reference potential VCOM, as the initial value of the potential applied to the cathode of the photoelectric conversion element 30.

This operation can cancel the threshold voltage Vthsf of the source follower transistor Msf that serves as a lowering factor of the detection accuracy of the light irradiating the photoelectric conversion element 30.

Then, the read transistor Mrd is controlled to be turned off, and after the storage period Pch following the reset period Prst elapses, the read transistor Mrd is controlled to be turned on to start the read period Pdet.

As a result, in the storage period Pch, the potential of the cathode of the photoelectric conversion element 30 is reduced by the voltage change amount Vphoto in response to the light irradiating the photoelectric conversion element 30 to reach the potential (=VCOM+Vthsf−Vphoto). At this time, the potential Vdet2 of the detection signal Vdet detected in the read period Pdet is set to the potential (=VCOM−Rd×Ib−Vphoto) obtained by canceling the threshold voltage Vthsf of the source follower transistor Msf.

According to the present embodiment, the detection device capable of reducing the variations in detection values can be obtained.

Second Embodiment

Figure 10:
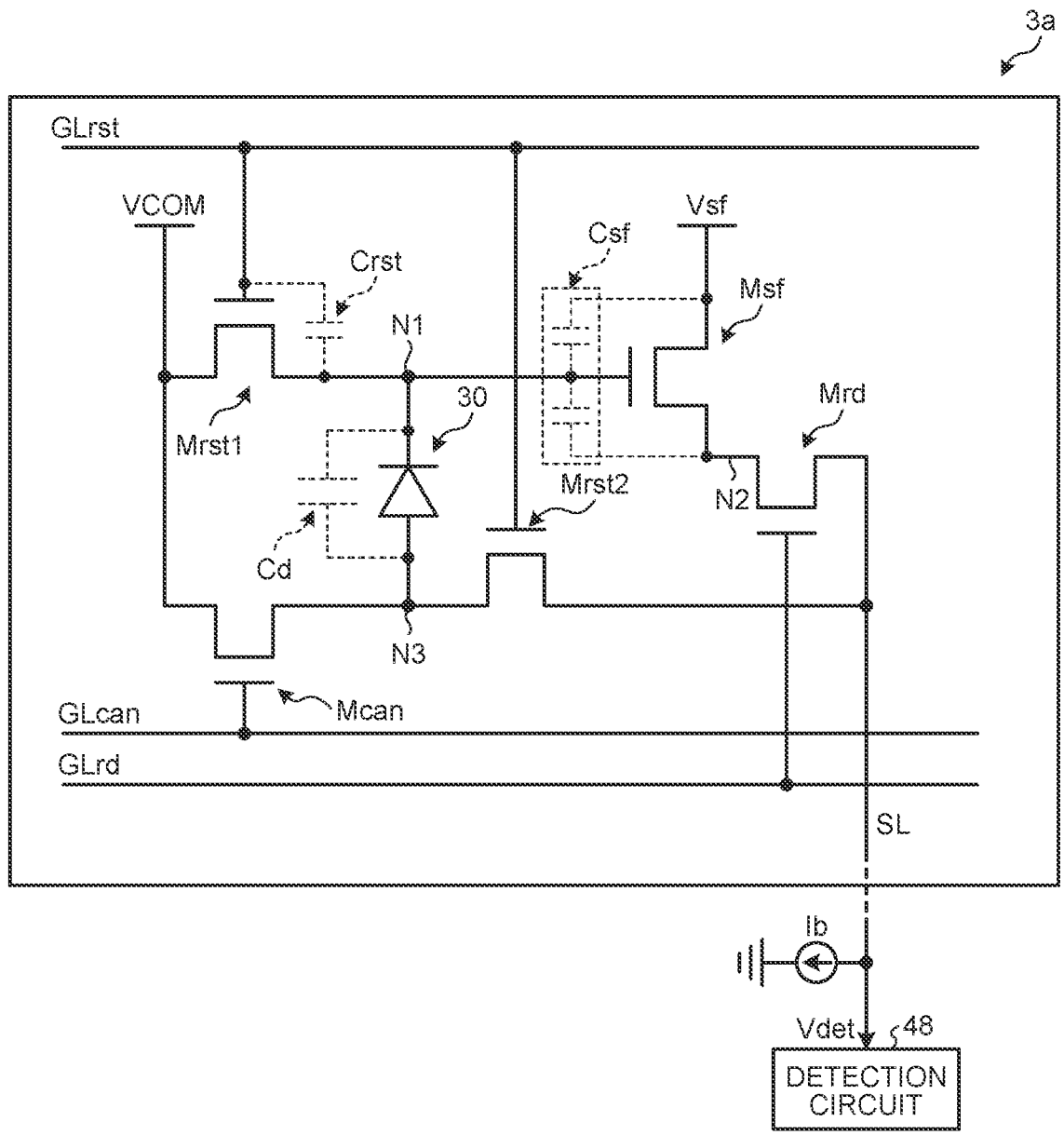
FIG. 10 is a circuit diagram illustrating a detection element according to a second embodiment of the present invention.

FIG. 10 is a circuit diagram illustrating a detection element according to a second embodiment of the present invention. A detection element 3a according to the second embodiment differs from the detection element 3 described in the first embodiment in that one of the source and the drain of the second reset transistor Mrst2 is coupled to the output signal line SL instead of the coupling point (node N2) between the source of the source follower transistor Msf and the read transistor Mrd. Components having the same functions as those of the first embodiment are denoted by the same reference numerals as those in the first embodiment, and will not be described below. The detection element 3a of the second embodiment will be described mainly in terms of differences from the first embodiment.

Figure 12A:
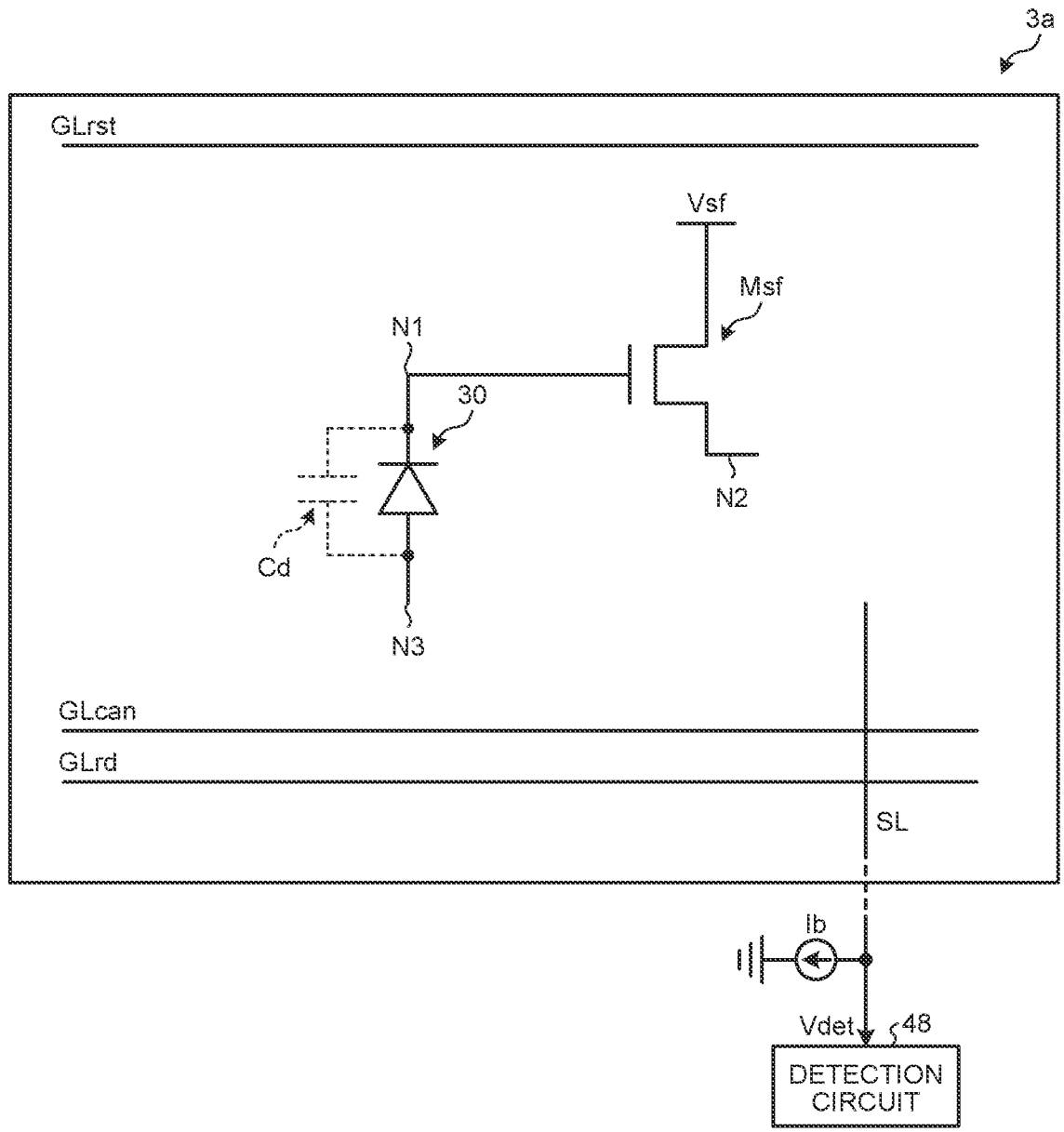
FIG. 12A is a diagram illustrating the equivalent circuit of the detection element during the period t0 to to, illustrated in FIG. 11.
Figure 12B:
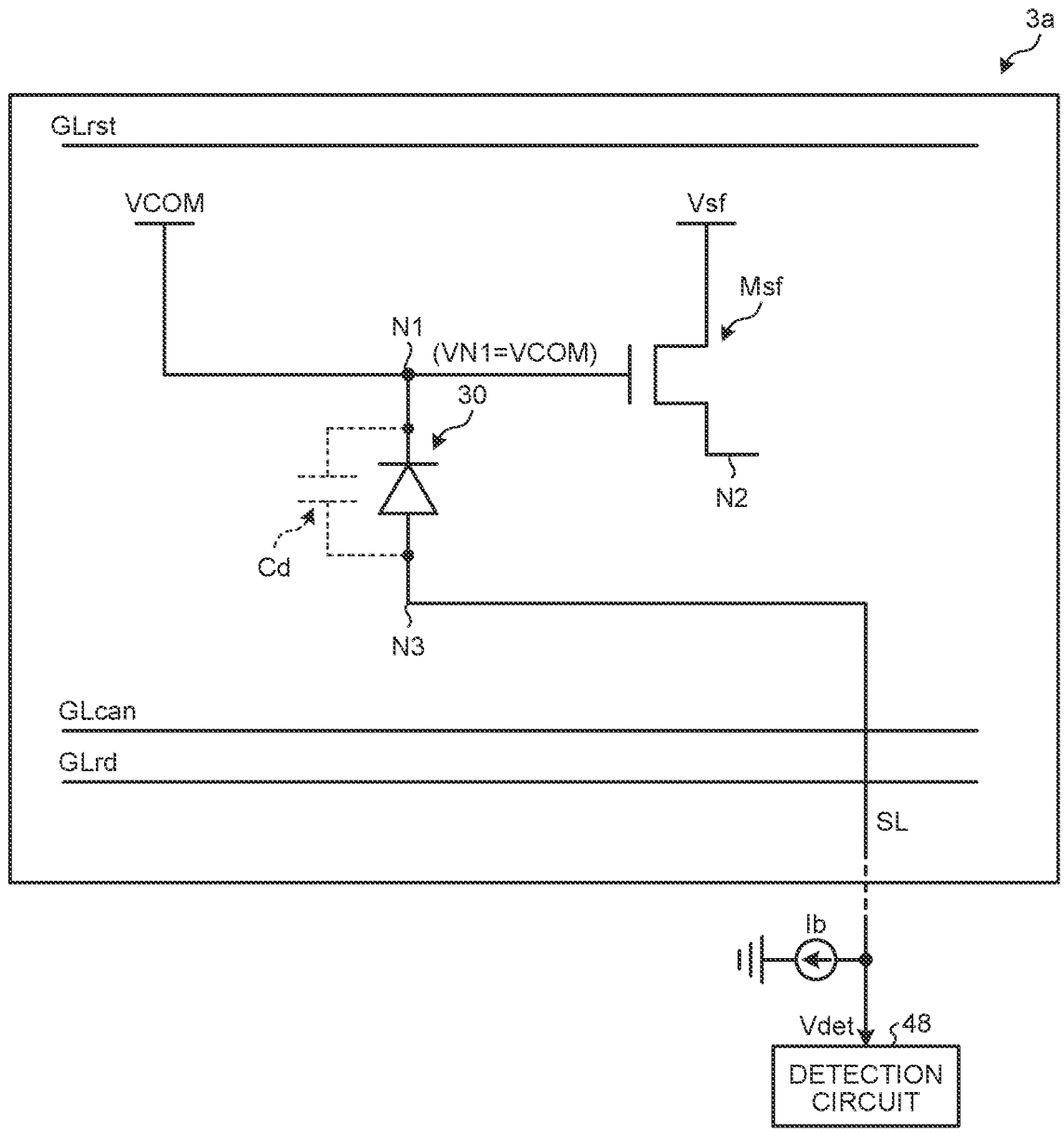
FIG. 12B is a diagram illustrating the equivalent circuit of the detection element during the period t0' to t1 illustrated in FIG. 11.
Figure 12C:
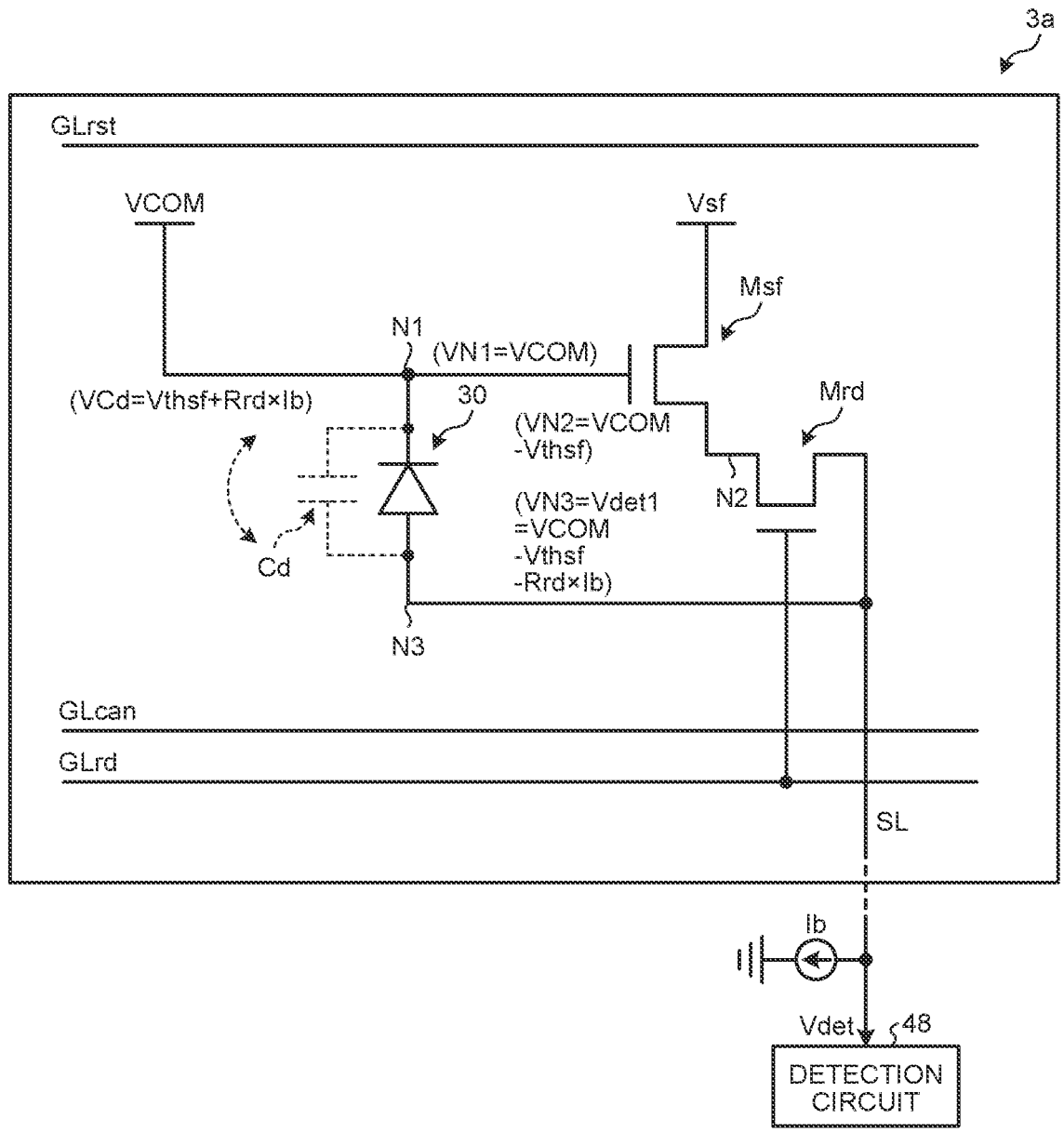
FIG. 12C is a diagram illustrating the equivalent circuit of the detection element during the period t1 to t2 illustrated in FIG. 11.
Figure 12D:
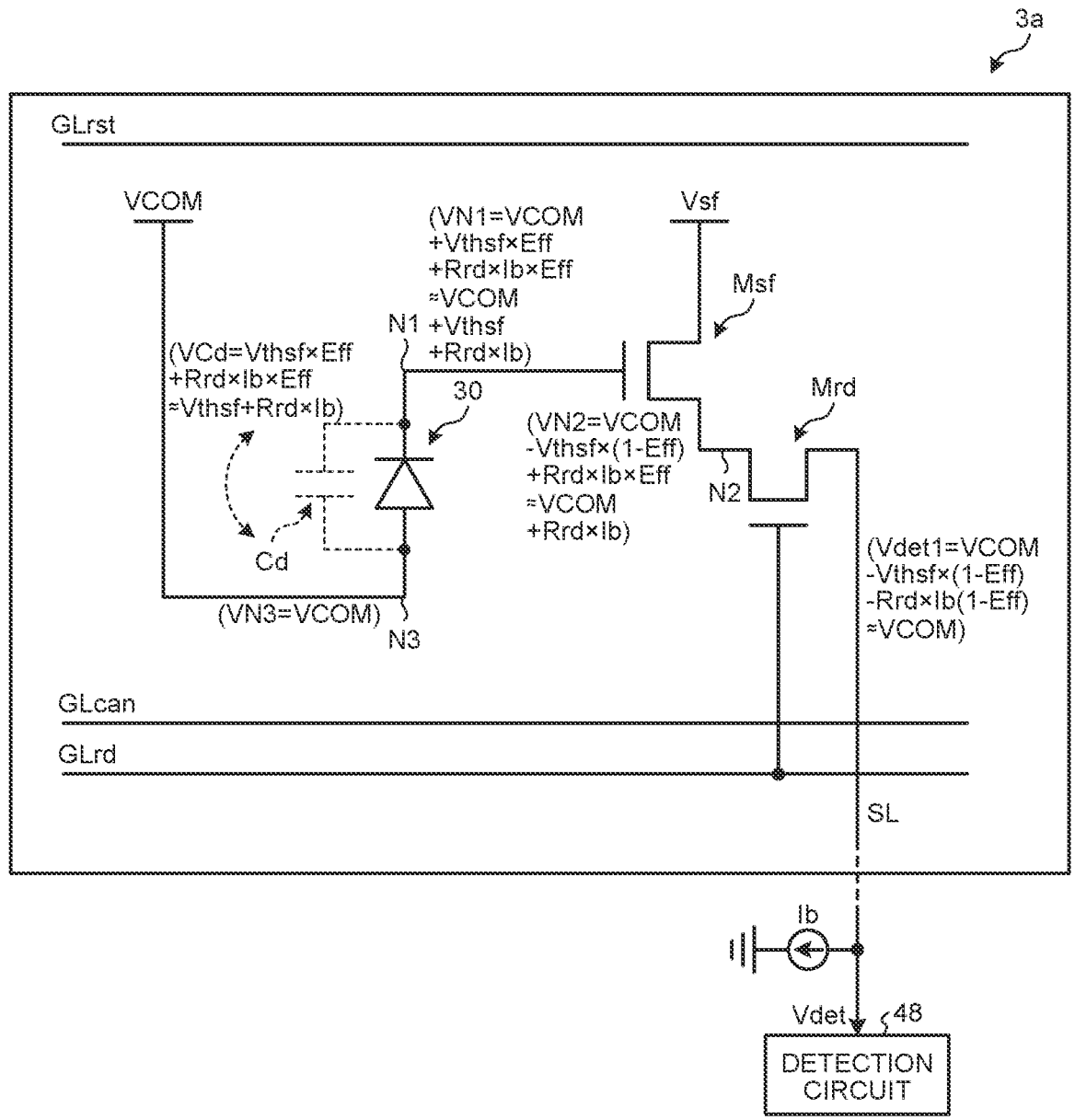
FIG. 12D is a diagram illustrating the equivalent circuit of the detection element during the period t2' to t3 illustrated in FIG. 11.
Figure 12E:
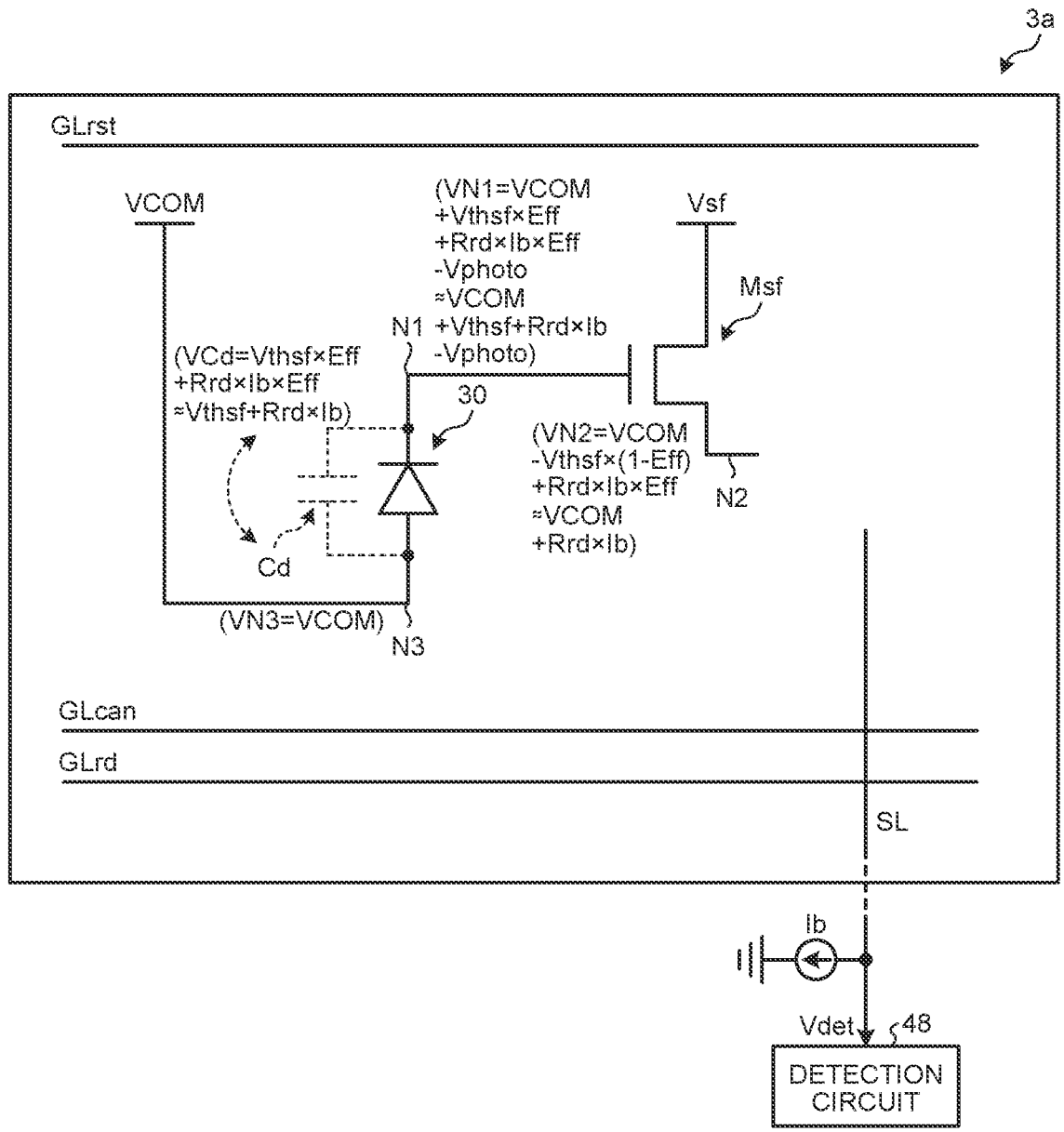
FIG. 12E is a diagram illustrating the equivalent circuit of the detection element during the period t3 to t4 illustrated in FIG. 11.
Figure 12F:
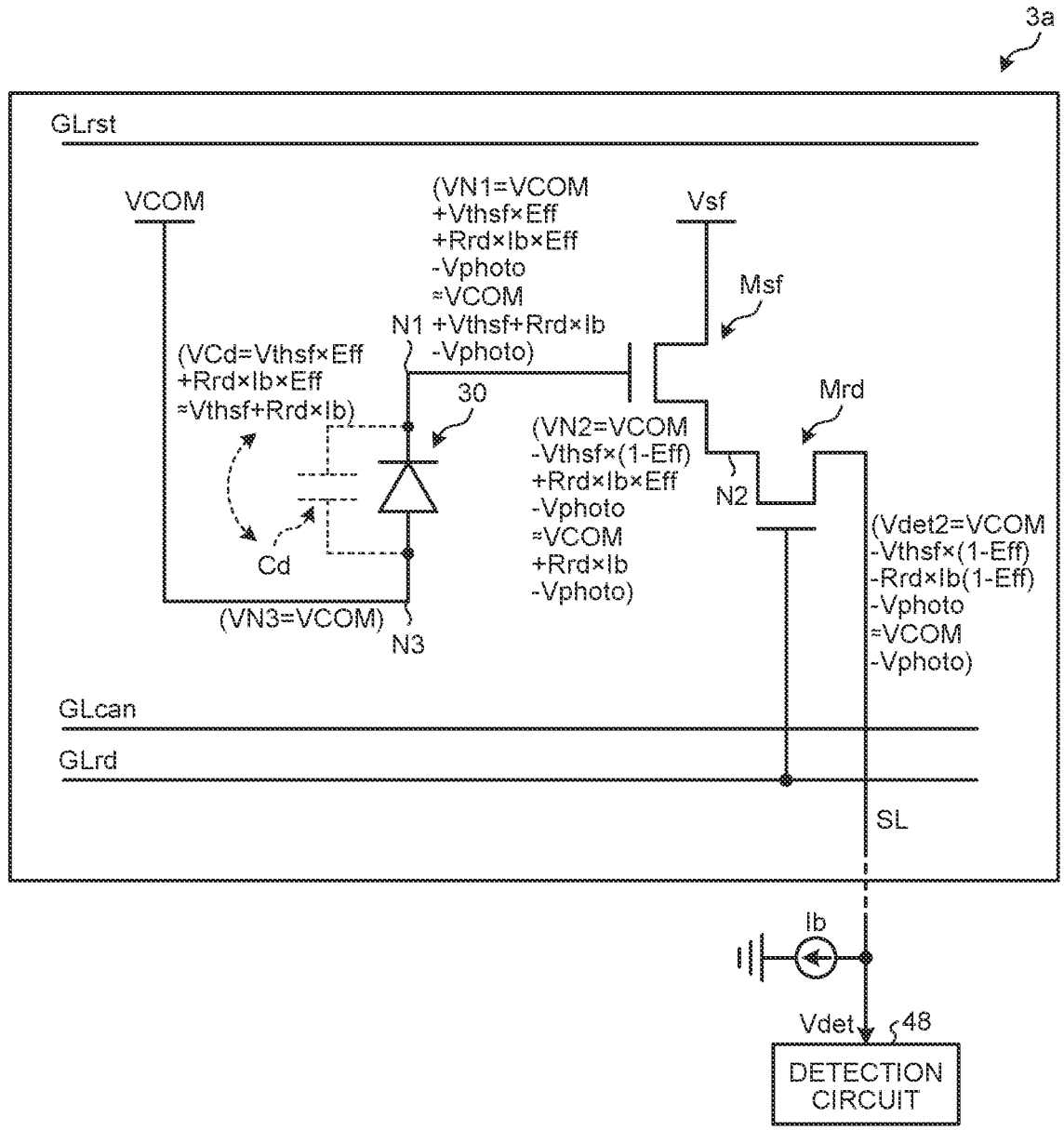
FIG. 12F is a diagram illustrating the equivalent circuit of the detection element during the period t4 to t5 illustrated in FIG. 11.

FIG. 11 is a timing waveform diagram illustrating an operation example of the detection element according to the second embodiment. FIG. 12A is a diagram illustrating the equivalent circuit of the detection element during the period t0 to t0' illustrated in FIG. 11. FIG. 12B is a diagram illustrating the equivalent circuit of the detection element during the period t0' to t1 illustrated in FIG. 11. FIG. 12C is a diagram illustrating the equivalent circuit of the detection element during the period t1 to t2 illustrated in FIG. 11. FIG. 12D is a diagram illustrating the equivalent circuit of the detection element during the period t2' to t3 illustrated in FIG. 11. FIG. 12E is a diagram illustrating the equivalent circuit of the detection element during the period t3 to t4 illustrated in FIG. 11. FIG. 12F is a diagram illustrating the equivalent circuit of the detection element during the period t4 to t5 illustrated in FIG. 11.

In the same manner as in the first embodiment, the detection element 3a performs the detection in the order of the reset period Prst, the storage period Pch, and the read period Pdet. The power supply circuit 103 supplies the reference potential VCOM to the detection element 3a over the reset period Prst, the storage period Pch, and the read period Pdet.

At time t0, the control circuit 102 sets the cancel control signal CAN supplied to the cancel control scan line to LOW (low-level voltage) (refer to FIG. 12A). This operation turns off the cancel transistor Mcan (into the non-conduction state).

Subsequently, at time t0', the control circuit 102 sets the reset control signal RST supplied to the reset control scan line GLrst to HIGH (high-level voltage). This operation starts the reset period Prst. In the reset period Prst, the first reset transistor Mrst1 and the second reset transistor Mrst2 are turned on (into the conduction state). This operation sets the potential VN1 of the node N1 to the reference potential VCOM, as represented by Expression (34) below (refer to FIG. 12B).

$$VN1 = VCOM \tag{34}$$

At time t1, the control circuit 102 sets the read control signal RD supplied to the read control scan line GLrd to HIGH (high-level voltage). This operation turns on the read transistor Mrd (into the conduction state). At this time, the potential VN2 of the node N2 is represented by Expression (35) below (refer to FIG. 12C).

$$VN2 = VCOM - Vthsf \tag{35}$$

At this time, the capacitance Cd of the photoelectric conversion element 30 between the nodes N1 and N3 is charged by the potential difference ΔVCd (=Vthsf+Rd×Ib) represented by Expression (36) below (refer to FIG. 12C).

$$\Delta VCd = Vthsf + Rd \times Ib \tag{36}$$

At this time, the potential VN3 of the node N3, that is, the potential Vdet1 of the detection signal Vdet output from the output signal line SL is represented by Expression (37) below (refer to FIG. 12C).

$$VN3 = Vdet1 = VCOM - Vthsf - Rrd \times Ib \tag{37}$$

The control circuit 102 sets the reset control signal RST to LOW (low-level voltage) at time t2, and sets the cancel control signal CAN to HIGH (high-level voltage) at time t2'.

This operation turns on the cancel transistor Mcan (into the conduction state) to set the potential VN3 of the node N3 to the reference potential VCOM, as represented by Expression (38) below (refer to FIG. 12D).

$$VN3 = VCOM \tag{38}$$

At this time, the voltage ΔVCd between both ends of the capacitance Cd of the photoelectric conversion element 30 can be represented by Expression (39) below.

$$\Delta VCd = (Vthsf + Rd \times Ib) \times (Cd/(Cd + Crst + Csf)) \tag{39}$$

When the term for the capacitance in Expression (39) above is expressed using the coefficient Eff represented by Expression (20) above in the same manner as in the first embodiment, Expression (39) above can be expressed as Expression (40) below (refer to FIG. 12D).

$$\Delta VCd = Vthsf \times Eff + Rd \times Ib \times Eff \tag{40}$$

The potential VN1 of the node N1 is set, as the initial value, to a potential obtained by superimposing the voltage ΔVCd (=Vthsf×Eff+Rd×Ib×Eff) between both ends of the capacitance Cd of the photoelectric conversion element 30 on the potential VN3 (=VCOM) of the node N3, as represented by Expression (41) below (refer to FIG. 12D).

$$VN1 = VN3 + \Delta VCd = VCOM + Vthsf \times Eff + Rd \times Ib \times Eff \tag{41}$$

In the present embodiment, the coefficient Eff can be approximated to one, in the same manner as in the first embodiment. Therefore, the voltage ΔVCd between both ends of the capacitance Cd of the photoelectric conversion element 30 represented by Expression (40) above can be expressed as Expression (42) below (refer to FIG. 12D).

$$\Delta VCd \approx Vthsf + Rd \times Ib \tag{42}$$

As a result, Expression (41) above can be transformed into Expression (43) below.

$$VN1 \approx VCOM + Vthsf + Rd \times Ib \tag{43}$$

The potential VN2 of the node N2 is set to a value (VCOM−Vthsf×(1−Eff)+Rd×Ib×Eff) obtained by subtracting the threshold voltage Vthsf of the source follower transistor Msf from the potential VN1 (=VCOM+Vthsf× Eff+Rd×Ib×Eff) of the node N1, as represented by Expression (44) below, and the potential Vdet1 of the detection signal Vdet output from the output signal line SL is set to a value obtained by subtracting the voltage drop (=Rrd×Ib) caused by the on-resistance Rrd of the read transistor Mrd from the potential VN2 (=VCOM−Vthsf×(1−Eff)+Rd×Ib× Eff) of the node N2, as represented by Expression (45) below.

$$VN2 = VN1 - Vthsf = (VCOM + Vthsf \times Eff + Rd \times Ib \times Eff) - Vthsf = VCOM - Vthsf \times (1 - Eff) + Rd \times Ib \times Eff \tag{44}$$

$$Vdet1 = VN2 - Rrd \times Ib = VCOM - Vthsf \times (1 - Eff) - Rrd \times Ib \times (1 - Eff) \tag{45}$$

When the coefficient Eff is approximated to one, Vthsf× (1−Eff) and Vthsf×(1−Eff)+Rrd×(1−Eff) illustrated in FIG. 11 can be regarded as zero (Vthsf×(1−Eff)≈, and Vthsf×(1− Eff)+Rrd×(1−Eff)≈0). As a result, Expressions (44) and (45) above can be transformed into Expressions (46) and (47) below.

$$VN2 \approx VCOM + Rrd \times Ib \times Eff \tag{46}$$

$$Vdet1 \approx VCOM \tag{47}$$

At time t3, the control circuit 102 sets the read control signal RD to LOW (low-level voltage). This operation ends the reset period Prst and starts the storage period Pch. At this time, the read transistor Mrd is turned off (into the non-conduction state) to set the potential VN2 of the node N2 to be constant at (VCOM−Vthsf×(1−Eff)+Rd×Ib×Eff (≈VCOM+Rrd×Ib×Eff)) represented by Expression (44) above (refer to FIG. 12E). The potential of the detection signal Vdet output from the output signal line SL is set to LOW (low-level voltage). The potential VN1 of the node N1 is reduced by the voltage change amount Vphoto in response to the light irradiating the photoelectric conversion element 30, as represented by Expression (48) below (refer to FIG. 12E).

$$VN1 = VCOM + Vthsf \times Eff + Rrd \times Ib \times Eff - V\text{photo}$$
$$(\approx VCOM + Vthsf + Rrd \times Ib - V\text{photo}) \quad (48)$$

At time t4, the control circuit 102 sets the read control signal RD to HIGH (high-level voltage). As a result, the read transistor Mrd is turned on (into the conduction state) to end the storage period Pch and start the read period Pdet. The potential VN2 of the node N2 is reduced by the voltage change amount Vphoto in response to the light irradiating the photoelectric conversion element 30, as represented by Expression (49) below (refer to FIG. 12F).

$$VN2 = VCOM - Vthsf \times (1 - Eff) + Rrd \times Ib \times Eff - V\text{photo}$$
$$(\approx VCOM + Rrd \times Ib - V\text{photo}) \quad (49)$$

At this time, the potential Vdet2 of the detection signal Vdet output in the read period Pdet is set to a value obtained by subtracting the voltage drop (Rrd×Ib) caused by the on-resistance Rrd of the read transistor Mrd from the potential VN2 (=VCOM−Vthsf×(1−Eff)+Rrd×Ib×Eff−Vphoto (≈VCOM+Rrd×Ib−Vphoto)) of the node N2, as represented by Expression (50) below (refer to FIG. 12F).

$$Vdet2 = VN2 - Rrd \times Ib = VCOM - Vthsf \times (1 - Eff) Rrd \times Ib \times$$
$$(1 - Eff) - V\text{photo}(\approx VCOM - V\text{photo}) \quad (50)$$

At time t5, the control circuit 102 sets the read control signal RD to LOW (low-level voltage). This operation ends the read period Pdet.

The detector 40 detects the potential Vdet2 of the detection signal Vdet at time t5 when the read period Pdet ends. While FIG. 11 illustrates the operation example of one of the detection elements 3a, the scan line drive circuit 15 sequentially scans the reset control scan lines GLrst, the read control scan lines GLrd, and the cancel control scan lines GLcan in a time-division manner. The detection elements 3a in the entire detection region AA can perform the detection processing by repeating this procedure.

In the second embodiment, the coefficient Eff can be approximated to one, in the same manner as in the first embodiment. Therefore, the terms for the threshold voltage Vthsf of the source follower transistor Msf and the voltage drop (Rrd×Ib) caused by the on-resistance Rrd of the read transistor Mrd in Expression (50) above can each be regarded as "0", and thus, Expression (51) below is obtained.

$$Vdet2 = VCOM - V\text{photo} \quad (51)$$

As a result, the potential Vdet2 of the detection signal Vdet output during the read period Pdet illustrated in FIG. 11 can cancel the voltage drop (Rrd×Ib) caused by the on-resistance Rrd of the read transistor Mrd in addition to the threshold voltage Vthsf of the source follower transistor Msf, and thus, the detection accuracy of the light irradiating the photoelectric conversion element 30 can be improved more than in the first embodiment.

As described above, the detection device 1 according to the second embodiment includes the first reset transistor Mrst1 that supplies or interrupts the reference potential VCOM to the cathode of the photoelectric conversion element 30, the second reset transistor Mrst2 that electrically couples or decouples between the anode of the photoelectric conversion element 30 and the output of the read transistor Mrd, and the cancel transistor Mcan that supplies or interrupts the reference potential VCOM to the anode of the photoelectric conversion element 30, and sets the potential (=VCOM+Vthsf+Rrd×Ib) obtained by superimposing the threshold voltage Vthsf of the source follower transistor Msf and the voltage drop (Rrd×Ib) caused by the on-resistance Rrd of the read transistor on the reference potential VCOM, as the initial value of the potential applied to the cathode of the photoelectric conversion element 30.

In the above-described configuration, during the reset period Prst, the first reset transistor Mrst1 and the second reset transistor Mrst2 are controlled to be turned on, and then, the read transistor Mrd is controlled to be turned on to charge the capacitance Cd of the photoelectric conversion element 30 by the potential difference (=Vthsf+Rrd×Ib) between the reference potential VCOM and the output potential (=VCOM−Vthsf−Rrd×Ib) of the read transistor Mrd, and further, the first reset transistor Mrst1 and the second reset transistor Mrst2 are controlled to be turned off, and the cancel transistor Mcan is controlled to be turned on to set the potential (=VCOM+Vthsf+Rrd×Ib) obtained by superimposing the voltage (=Vthsf+Rrd×Ib) between both ends of the capacitance Cd of the photoelectric conversion element 30 on the reference potential VCOM, as the initial value of the potential applied to the cathode of the photoelectric conversion element 30.

This operation can cancel the voltage drop (Rrd×Ib) caused by the on-resistance Rrd of the read transistor Mrd in addition to the threshold voltage Vthsf of the source follower transistor Msf, and thus, the detection accuracy of the light irradiating the photoelectric conversion element 30 can be improved more than in the first embodiment.

Then, the read transistor Mrd is controlled to be turned off, and after the storage period Pch following the reset period Prst elapses, the read transistor Mrd is controlled to be turned on to start the read period Pdet.

As a result, in the storage period Pch, the potential of the cathode of the photoelectric conversion element 30 is reduced by the voltage change amount Vphoto in response to the light irradiating the photoelectric conversion element 30 to reach the potential (=VCOM+Vthsf+Rrd×Ib−Vphoto). At this time, the potential Vdet2 of the detection signal Vdet detected in the storage period Pch is set to the potential (=VCOM−Vphoto) obtained by canceling the threshold voltage Vthsf of the source follower transistor Msf and the voltage drop (Rrd×Ib) caused by the on-resistance Rrd of the read transistor Mrd.

According to the present embodiment, the detection device capable of reducing the variations in detection values can be obtained.

The components in the embodiments described above can be combined with each other as appropriate. Other operational advantages accruing from the aspects described in the embodiments herein that are obvious from the description herein or that are appropriately conceivable by those skilled in the art will naturally be understood as accruing from the present invention.

What is claimed is:
1. A detection device comprising:
   a sensor area in which a detection element comprising a photoelectric conversion element is disposed in a detection region; and a detection circuit configured to process a detection signal output from the detection element, wherein
the detection element comprises:
a source follower transistor configured to output a signal corresponding to an electric charge generated by the photoelectric conversion element;
a read transistor configured to read the output signal of the source follower transistor, and output the detection signal;
a first reset transistor configured to supply or interrupt a reference potential to a cathode of the photoelectric conversion element;
a second reset transistor configured to electrically couple or decouple between an anode of the photoelectric conversion element and an output of the source follower transistor; and
a cancel transistor configured to supply or interrupt the reference potential to the anode of the photoelectric conversion element.

2. The detection device according to claim 1, wherein
a potential obtained by superimposing at least a threshold voltage of the source follower transistor on the reference potential is set as an initial value of a potential applied to the cathode of the photoelectric conversion element in a reset period.

3. The detection device according to claim 1, wherein
capacitance of the photoelectric conversion element is charged by a potential difference between an input and an output of the source follower transistor, and
a potential obtained by superimposing a voltage between both ends of the photoelectric conversion element on the reference potential is set as the initial value in the reset period.

4. The detection device according to claim 3, wherein the potential obtained by superimposing the voltage between both ends of the photoelectric conversion element on the reference potential is applied to the input of the source follower transistor after the capacitance of the photoelectric conversion element is charged by the potential difference between the input and the output of the source follower transistor in the reset period.

5. The detection device according to claim 1, further comprising a drive circuit configured to supply a plurality of drive signals to a plurality of the detection elements, wherein the drive signals comprise:
a read control signal to control the read transistor;
a reset control signal to control the first reset transistor and the second reset transistor; and
a cancel control signal to control the cancel transistor, and
the detection device further comprises:
a read control scan line configured to supply the read control signal to the read transistor;
a reset control scan line configured to supply the reset control signal to the first reset transistor and the second reset transistor; and
a cancel control scan line configured to supply the cancel control signal to the cancel transistor.

6. The detection device according to claim 1, further comprising a drive circuit configured to supply a plurality of drive signals to a plurality of the detection elements, wherein the drive circuit is configured to:
control the first reset transistor and the second reset transistor to be turned on, and then, control the read transistor to be turned on, and further, control the first reset transistor and the second reset transistor to be turned off, and control the cancel transistor to be turned on, and then, control the read transistor to be turned off, in the reset period, and
control the read transistor to be turned on to start a read period after a storage period following the reset period elapses.

7. A detection device comprising:
a sensor area in which a detection element comprising a photoelectric conversion element is disposed in a detection region; and
a detection circuit configured to process a detection signal output from the detection element, wherein
the detection element comprises:
a source follower transistor configured to output a signal corresponding to an electric charge generated by the photoelectric conversion element;
a read transistor configured to read the output signal of the source follower transistor, and output the detection signal;
a first reset transistor configured to supply or interrupt a reference potential to a cathode of the photoelectric conversion element;
a second reset transistor configured to electrically couple or decouple between an anode of the photoelectric conversion element and an output of the read transistor; and
a cancel transistor configured to supply or interrupt the reference potential to the anode of the photoelectric conversion element.

8. The detection device according to claim 7, wherein
a potential obtained by superimposing a threshold voltage of the source follower transistor and a voltage drop caused by on-resistance of the read transistor on the reference potential is set as an initial value of a potential applied to the cathode of the photoelectric conversion element in a reset period.

9. The detection device according to claim 7, wherein
capacitance of the photoelectric conversion element is charged by a potential difference between an input of the source follower transistor and an output of the read transistor, and
a potential obtained by superimposing a voltage between both ends of the photoelectric conversion element on the reference potential is set as the initial value in the reset period.

10. The detection device according to claim 9, wherein the potential obtained by superimposing the voltage between both ends of the photoelectric conversion element on the reference potential is applied to the input of the source follower transistor after the capacitance of the photoelectric conversion element is charged by the potential difference between the input of the source follower transistor and the output of the read transistor in the reset period.

* * * * *